(12) United States Patent
Park et al.

(10) Patent No.: US 9,917,231 B2
(45) Date of Patent: Mar. 13, 2018

(54) FLUORIDE PHOSPHOR AND LIGHT EMITTING DEVICE, AND METHODS OF MANUFACTURING THE SAME

(71) Applicant: Samsung Electronics Co., Ltd., Suwon-si (KR)

(72) Inventors: Jong Won Park, Seoul (KR); In Hyung Lee, Hanam-Si (KR); Tae Hoon Kim, Suwon-Si (KR); Ji Ho You, Seoul (KR); Chi Woo Lee, Cheonan-Si (KR); Chul Soo Yoon, Suwon-Si (KR)

(73) Assignee: SAMSUNG ELECTRONICS CO., LTD., Samsung-ro, Yeongtong-gu, Suwon-si Gyeonggi-do (KR)

( * ) Notice: Subject to any disclaimer, the term of this patent is extended or adjusted under 35 U.S.C. 154(b) by 128 days.

(21) Appl. No.: 14/839,798

(22) Filed: Aug. 28, 2015

(65) Prior Publication Data
US 2016/0133799 A1    May 12, 2016

(30) Foreign Application Priority Data
Nov. 10, 2014   (KR) .................. 10-2014-0155324

(51) Int. Cl.
*H01L 33/50*    (2010.01)
*H01L 33/52*    (2010.01)
*C09K 11/61*    (2006.01)

(52) U.S. Cl.
CPC .......... *H01L 33/502* (2013.01); *C09K 11/617* (2013.01); *H01L 2224/48091* (2013.01); *H01L 2224/48137* (2013.01); *H01L 2224/48247* (2013.01); *H01L 2224/48257* (2013.01); *H01L 2924/181* (2013.01)

(58) Field of Classification Search
CPC ....... C09K 11/57; C09K 11/617; C09K 11/61; H01L 33/502; H01L 33/504
See application file for complete search history.

(56) References Cited

U.S. PATENT DOCUMENTS

| | | |
|---|---|---|
| 3,576,756 A | 4/1971 | Russo |
| 5,162,930 A | 11/1992 | Sluzky et al. |
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |

(Continued)

FOREIGN PATENT DOCUMENTS

| | | | |
|---|---|---|---|
| JP | 2010-254933 A | † | 11/2010 |
| KR | 10-0620556 B1 | | 9/2006 |

(Continued)

*Primary Examiner* — Carol M Koslow
(74) *Attorney, Agent, or Firm* — Muir Patent Law, PLLC

(57) ABSTRACT

A fluoride phosphor may include: a fluoride represented by a composition formula: $A_xMF_y:Mn_z^{4+}$, where A is at least one selected from among Li, Na, K, Rb, and Cs, M is at least one selected from among Si, Ti, Zr, Hf, Ge and Sn, a composition ratio (x) of A satisfies $2 \leq x \leq 3$, a composition ratio (y) of F satisfies $4 \leq y \leq 7$, and a composition ratio (z) of Mn satisfies $0 < z \leq 0.17$.

15 Claims, 16 Drawing Sheets

(56) References Cited

U.S. PATENT DOCUMENTS

| | | | |
|---|---|---|---|
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,646,141 B2 | 1/2010 | Kim et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,057,706 B1 * | 11/2011 | Setlur | C09K 11/02 252/301.4 F |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,377,334 B2 * | 2/2013 | Lyons | C09K 11/025 252/301.4 H |
| 8,399,944 B2 | 3/2013 | Kwak et al. | |
| 8,432,511 B2 | 4/2013 | Jeong | |
| 8,459,832 B2 | 6/2013 | Kim | |
| 8,491,816 B2 * | 7/2013 | Hong | C09K 11/616 252/301.4 H |
| 8,502,242 B2 | 8/2013 | Kim | |
| 8,536,604 B2 | 9/2013 | Kwak et al. | |
| 8,710,487 B2 | 4/2014 | Lyons et al. | |
| 8,735,931 B2 | 5/2014 | Han et al. | |
| 8,766,295 B2 | 7/2014 | Kim | |
| 2006/0169998 A1 * | 8/2006 | Radkov | C09K 11/617 257/98 |
| 2009/0020775 A1 | 1/2009 | Radkov et al. | |
| 2010/0142189 A1 † | 6/2010 | Hong | |
| 2012/0329184 A1 | 12/2012 | Petry et al. | |
| 2015/0162506 A1 * | 6/2015 | Lee | H01L 33/502 438/29 |
| 2015/0380613 A1 † | 12/2015 | Hiramatsu | |

FOREIGN PATENT DOCUMENTS

| | | |
|---|---|---|
| KR | 10-2013-0055361 A | 5/2013 |
| KR | 10-2013-0065378 A | 6/2013 |

\* cited by examiner
† cited by third party

FLUORIDE PHOSPHOR AND LIGHT EMITTING DEVICE, AND METHODS OF MANUFACTURING THE SAME

CROSS-REFERENCE TO RELATED APPLICATION

This application claims the priority to and benefit of Korean Patent Application No. 10-2014-0155324 filed on Nov. 10, 2014, with the Korean Intellectual Property Office, the disclosure of which is incorporated herein by reference.

BACKGROUND

The present inventive concept relates to a fluoride phosphor, a light emitting device, a method of manufacturing the fluoride phosphor, and a method of manufacturing the light emitting device.

In general, semiconductor light emitting devices emit light through recombination of electrons and holes when an electrical current is applied thereto, and have been widely used as light sources due to several inherent advantages thereof, such as relatively low power consumption, high degrees of luminance, compactness, and the like. In particular, after the development of nitride-based light emitting devices, the range of applications of semiconductor light emitting devices has expanded, and such semiconductor light emitting devices have been employed in backlight units, domestic lighting devices, automobile lighting devices, and the like.

Light emitting devices using the semiconductor light emitting devices as described above may include a light emitting element providing excitation light, and phosphors excited by light having been emitted by the light emitting element to thereby emit wavelength-converted light, and desired color characteristics may be implemented therein. Accordingly, research into phosphors having excellent color reproducibility and reliability, as well as light emitting devices using such phosphors, has been demanded.

SUMMARY

An aspect of the present inventive concept may provide a fluoride phosphor having improved optical characteristics and reliability, and a method of manufacturing the same.

An aspect of the present inventive concept may also provide a light emitting device having improved optical characteristics and reliability, using the fluoride phosphor, and a method of manufacturing the same.

According to an aspect of the present inventive concept, a fluoride phosphor may include a fluoride represented by a composition formula: $A_xMF_y:Mn_z^{4+}$, where A is at least one selected from among Li, Na, K, Rb, and Cs, M is at least one selected from among Si, Ti, Zr, Hf, Ge and Sn, a composition ratio (x) of A satisfies $2 \leq x \leq 3$, a composition ratio (y) of F satisfies $4 \leq y \leq 7$, and a composition ratio (z) of Mn satisfies $0 < z \leq 0.17$.

The fluoride phosphor may have a particle size of 15 μm to 25 μm.

The fluoride phosphor may have an internal quantum efficiency of 80% or greater.

The fluoride phosphor may absorb light having a peak wavelength within a range of 300 nm to 500 nm and may emit red light having a peak wavelength within a range of 620 nm to 640 nm.

The composition ratio (z) of Mn may satisfy $0.10 \leq z \leq 0.17$.

In the fluoride phosphor, Mn may be contained in an amount of 3.4 wt. % to 3.8 wt. %.

The fluoride phosphor may be $K_2SiF_6:Mn^{4+}$.

According to an aspect of the present inventive concept, a light emitting device may include: a light emitting element, and a wavelength conversion part absorbing excitation light emitted by the light emitting element and emitting visible light, wherein the wavelength conversion part includes a fluoride phosphor including a fluoride represented by a composition formula: $A_xMF_y:Mn_z^{4+}$, where A is at least one selected from among Li, Na, K, Rb, and Cs, M is at least one selected from among Si, Ti, Zr, Hf, Ge and Sn, a composition ratio (x) of A satisfies $2 \leq x \leq 3$, a composition ratio (y) of F satisfies $4 \leq y \leq 7$, and a composition ratio (z) of Mn satisfies $0 < z \leq 0.17$.

The light emitting element may emit light having a peak wavelength within a range of 300 nm to 500 nm.

The fluoride phosphor may emit red light having a peak wavelength within a range of 620 nm to 640 nm.

In the fluoride phosphor, the composition ratio (z) of Mn may satisfy $0.10 \leq z \leq 0.17$.

The wavelength conversion part may further include a green phosphor absorbing light emitted by the light emitting element and emitting green light.

The green phosphor may emit green light having a peak wavelength within a range of 500 nm to 600 nm.

The light emitting element may simultaneously emit blue light and green light.

The wavelength conversion part may further include an organic or inorganic material coating layer coating the fluoride phosphor.

The light emitting device may further include a protective layer disposed on at least one surface of the wavelength conversion part and performing a waterproofing function.

According to an aspect of the present inventive concept, a method of manufacturing a fluoride phosphor represented by the following chemical formula 1, may include preparing a first solution containing a manganese compound, preparing a second solution by adding a first raw material containing M to the first solution, forming precipitates by adding a third solution including a second raw material containing A, to the second solution, and washing the precipitates using a washing solution containing at least one of a hydrofluoric acid and acetone, $$A_xMF_y:Mn_z^{4+}, \qquad \text{[Chemical Formula 1]}$$

where A is at least one selected from among Li, Na, K, Rb, and Cs, M is at least one selected from among Si, Ti, Zr, Hf, Ge and Sn, a composition ratio (x) of A satisfies $2 \leq x \leq 3$, a composition ratio (y) of F satisfies $4 \leq y \leq 7$, and a composition ratio (z) of Mn satisfies $0 < z \leq 0.17$.

In the forming of the precipitates, a particle size of the manufactured fluoride phosphor may be controlled by a time for which the third solution is added to the second solution or the amount of times the third solution is added.

The manufactured fluoride phosphor may have a particle size of 15 μm to 25 μm.

In the fluoride phosphor, Mn may be contained in an amount of 3.4 wt. % to 3.8 wt. %.

The preparing of the first solution may include dissolving the manganese compound having a composition of $A_xMnF_y$ in an aqueous hydrofluoric acid solution.

The first raw material may be at least one of $H_xMF_y$ and $A_xMF_y$ and the second raw material may be $AHF_2$.

The method may further include drying the precipitates, and coating a particle surface of the manufactured fluoride phosphor with an organic or inorganic material.

According to an aspect of the present inventive concept, a method of manufacturing a light emitting device may include mounting a light emitting element on a substrate, preparing a fluoride phosphor absorbing excitation light emitted by the light emitting element and emitting visible light, the fluoride phosphor being represented by the following chemical formula 1, and forming a wavelength conversion part including the fluoride phosphor on the light emitting element, $$A_xMF_y:Mn_z^{4+},$$ [Chemical Formula 1]

where A is at least one selected from among Li, Na, K, Rb, and Cs, M is at least one selected from among Si, Ti, Zr, Hf, Ge and Sn, a composition ratio (x) of A satisfies 2≤x≤3, a composition ratio (y) of F satisfies 4≤y≤7, and a composition ratio (z) of Mn satisfies 0<z≤0.17.

According to an aspect of the present inventive concept, a method of manufacturing a fluoride phosphor may include preparing a first solution containing a manganese compound, preparing a second solution by adding a first raw material containing M to the first solution, where M is at least one selected from among Si, Ti, Zr, Hf, Ge and Sn, preparing a third solution including a second raw material containing A, where A is at least one selected from among Li, Na, K, Rb, and Cs, adding the third solution to the second solution by a plurality of separate adding processes with intervals therebetween, so as to form precipitates, and washing the precipitates using a washing solution containing at least one of a hydrofluoric acid and acetone.

The fluoride phosphor may be represented by a composition formula: $A_xMF_y:Mn_z^{4+}$, where a composition ratio (x) of A satisfies 2≤x≤3, a composition ratio (y) of F satisfies 4≤y≤7, and a composition ratio (z) of Mn satisfies 0<z≤0.17.

The manufactured fluoride phosphor may have a particle size of 15 μm to 25 μm.

In the fluoride phosphor, Mn may be contained in an amount of 3.4 wt. % to 3.8 wt. %.

The preparing of the first solution may include dissolving the manganese compound having a composition of $A_xMnF_y$ in an aqueous hydrofluoric acid solution.

The first raw material may be at least one of $H_xMF_y$ and $A_xMF_y$, and the second raw material may be $AHF_2$.

The method may further include drying the precipitates, and coating a surface of the manufactured fluoride phosphor with an organic or inorganic material.

BRIEF DESCRIPTION OF DRAWINGS

The above and other aspects, features and other advantages of the present inventive concept will be more clearly understood from the following detailed description taken in conjunction with the accompanying drawings, in which.

DETAILED DESCRIPTION

Figure 1:
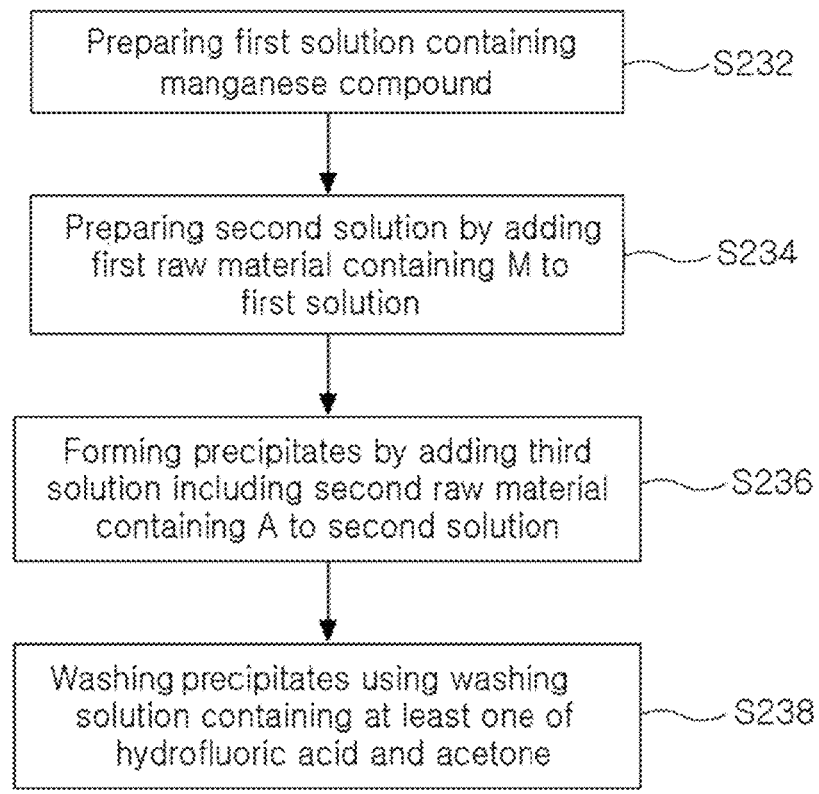
FIG. 1 is a flowchart illustrating a method of manufacturing a fluoride phosphor according to an exemplary embodiment of the present inventive concept.

Exemplary embodiments of the present inventive concept will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Reference throughout this disclosure to "an exemplary embodiment" is provided to emphasize a particular feature, structure, or characteristic, and do not necessarily refer to the same embodiment. Furthermore, the particular features, structures, or characteristics may be combined in any suitable manner in one or more embodiments. For example, a context described in a specific exemplary embodiment may be used in other embodiments, even if it is not described in the other embodiments, unless it is described contrary to or inconsistent with the context in the other embodiments.

Unless explicitly described otherwise, in the specification, the terms 'above', 'upper portion', 'upper surface', 'below' lower portion', 'lower surface', 'side surface' and the like, are used based on the drawings, and may actually be different depending on a direction in which a component is disposed.

A fluoride phosphor according to an exemplary embodiment of the present inventive concept may contain a fluoride represented by a composition formula: $A_xMF_y:Mn_z^{4+}$, and the composition formula may satisfy the following conditions:

1) A is at least one selected from among Li, Na, K, Rb, and Cs;
2) M is at least one selected from among Si, Ti, Zr, Hf, Ge and Sn;
3) A composition ratio (x) of A is in a range of $2 \leq x \leq 3$;
4) A composition ratio (y) of F is in a range of $4 \leq y \leq 7$; and
5) A composition ratio (z) of Mn is in a range of $0 < z \leq 0.17$.

The fluoride phosphor represented by the composition formula may contain $K_2SiF_6:Mn^{4+}$, $K_2TiF_6:Mn^{4+}$, $K_2SnF_6:Mn^{4+}$, $Na_2TiF_6:Mn^{4+}$, $Na_2ZrF_6:Mn^{4+}$, $K_3SiF_7:Mn^{4+}$, $K_3ZrF_7:Mn^{4+}$ and $K_3SiF_7:Mn^{4+}$. The fluoride phosphor may be excited by light having a wavelength between that of an ultraviolet region and that of the blue region to emit red light. For example, an exemplary embodiment of the present inventive concept may provide a red phosphor that absorbs excitation light having a peak wavelength in a range of 300 nm to 500 nm and emits light having a peak wavelength in a range of 620 nm to 640 nm.

The fluoride phosphor may contain a small amount of manganese (Mn) equal to or less than 1.5 at. % or 1.5 mol. %, and may contain a small amount of Mn equal to or less than 4 wt. %, for example, in a range of 3.4 wt. % to 3.8 wt. %. In particular, the composition ratio (z) of Mn may be selected to have a low value within a range in which the fluoride phosphor may be crystallized and precipitated at the time of the manufacturing thereof. For example, the composition ratio (z) of Mn may satisfy $0.10 \leq z \leq 0.17$.

The fluoride phosphor may have a relatively low composition ratio of Mn while having a particle size of 15 μm to 25 μm.

FIG. 1 is a flowchart illustrating a method of manufacturing a fluoride phosphor according to an exemplary embodiment of the present inventive concept.

Hereinafter, as an example of a fluoride phosphor having a composition formula of $K_2SiF_6:Mn^{4+}$, a method of manufacturing the fluoride phosphor according to an exemplary embodiment of the present inventive concept will be explained with reference to FIG. 1.

As shown in FIG. 1, the method of manufacturing the fluoride phosphor according to an exemplary embodiment of the present inventive concept may include preparing a first solution containing a manganese compound (S232), preparing a second solution by adding a first raw material containing the M to the first solution (S234), forming precipitates by adding a third solution including a second raw material containing the A, to the second solution (S236), and washing the precipitates using a washing solution containing at least one of a hydrofluoric acid and acetone (S238). The processes may be performed at room temperature, but is not limited thereto.

First, process S232 for preparing the first solution containing the manganese compound will be performed. The first solution may be manufactured by dissolving the manganese compound having a composition of $A_xMnF_y$, in an aqueous hydrofluoric (HF) acid solution. Specifically, the first solution may be manufactured by dissolving $K_2MnF_6$ in the aqueous hydrofluoric acid solution.

Next, process S234 for preparing the second solution by adding the first raw material containing the M to the first solution may be performed. The first raw material may be at least one of $H_xMF_y$, and $A_xMF_y$, for example, $H_2SiF_6$ or $K_2SiF_6$.

In this exemplary embodiment, it is illustrated that the manganese compound and the first raw material containing the M are sequentially introduced to the HF solution, but alternatively, an HF solution in which the manganese compound and the first raw material containing the M are mixed in a different introduction order may be prepared. For example, after the first raw material containing the M is introduced to the HF solution, the manganese compound may be introduced thereto.

Next, process S236 for forming the precipitates by adding the third solution including the second raw material containing the A, to the second solution may be performed. The second raw material may be $AHF_2$, for example, $KHF_2$, and may be in a saturation solution state or a powder state. The precipitates formed in the process may exhibit an orange color. A particle size of a fluoride phosphor manufactured may be controlled by a time for which the third solution is added to the second solution or the amount of times the third solution is added. For example, the third solution may be divided into appropriate amounts and added to the second solution through a plurality of separate processes, intervals for a reaction being present between the respective processes.

Next, process S238 for washing the precipitates using the washing solution containing at least one of a hydrofluoric acid and acetone may be performed. The washing process may be performed by stirring the precipitates using an aqueous hydrofluoric acid solution having a high concentration of approximately 49%, whereby impurities present in the precipitates, remaining portions of the first and second raw materials, and the like may be removed. In an exemplary embodiment, the washing process may be conducted in multiple times, using different washing solutions.

Thereafter, the washed precipitates are dried to obtain the fluoride phosphor according to an exemplary embodiment of the present inventive concept. In an exemplary embodiment, the method of manufacturing the fluoride phosphor may further include coating a particle surface of the manufactured fluoride phosphor with an organic or inorganic material.

Through the processes, a fluoride phosphor having a relatively small amount of manganese may be manufactured. However, in the case of manufacturing the fluoride phosphor having a relatively small amount of manganese by simply adjusting only the amount of the manganese compound, the particle size of the fluoride phosphor may be decreased. Thus, in an exemplary embodiment of the present inventive concept, the amount of the manganese compound, a time for which the third solution is added to the second solution or the amount of times the third solution is added, and the amounts of the first and second raw materials may be adjusted together.

Hereinafter, the phosphor manufactured by the manufacturing method according to the exemplary embodiment of the present inventive concept will be described in further detail with reference to a concrete inventive example and comparative examples.

Fluoride phosphors according to comparative example 1, comparative example 2, and the exemplary embodiment of the present inventive concept may be manufactured by varying the amount of a manganese compound in the first solution and the amounts of the respective first and second raw materials within the second and third solutions. Specifically, 22 mmol (milimole) of $K_2MnF_6$ was added to 720 mL of an aqueous hydrofluoric acid solution in the comparative example 1 and 15 mmol of $K_2MnF_6$ was added to 720 mL of an aqueous hydrofluoric acid solution in the comparative example 2, while in the inventive example, 12 mmol of $K_2MnF_6$ was added to 720 mL of an aqueous hydrofluoric acid solution. As the first raw material, $H_2SiF_6$ was used in a solution state of 34% in an amount of 200 mmol to 240 mmol, while as the second raw material, $KHF_2$ was used in a saturated solution state in an amount of 1.0 mol to 1.3 mol. The amount of $H_2SiF_6$ used in the inventive example was greater than that of the comparative example 1 and was identical to that of the comparative example 2, while the amount of $KHF_2$ used in the inventive example was less than those of the comparative examples 1 and 2.

Figure 2A:
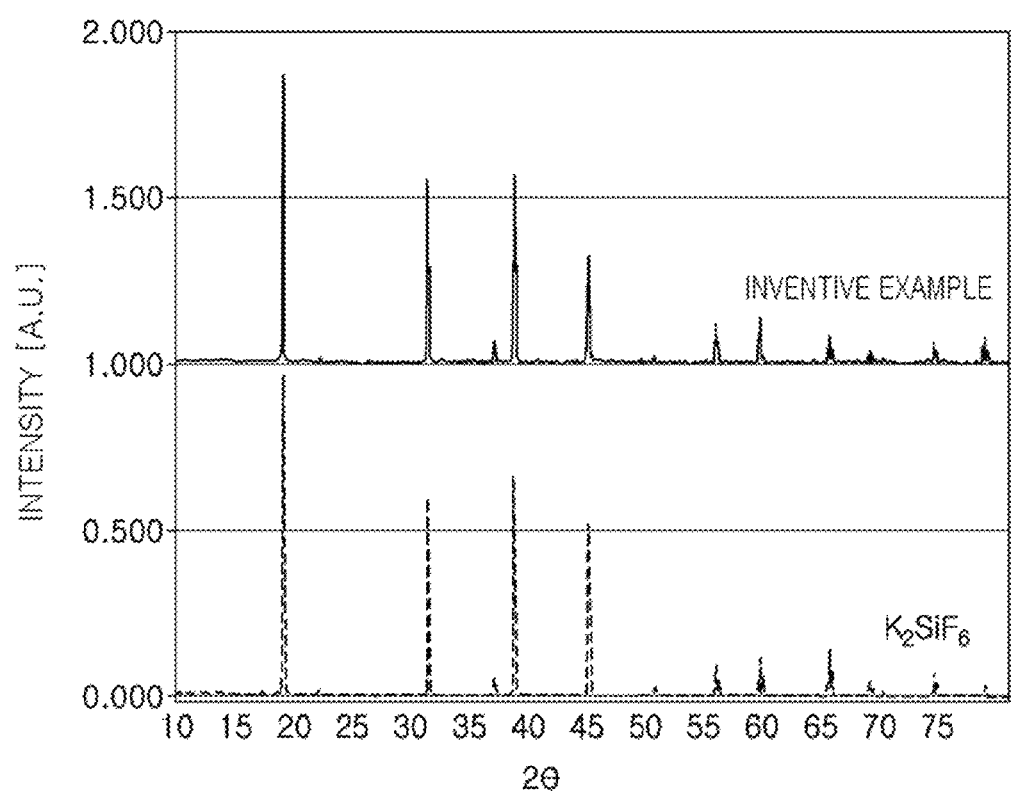
FIG. 2A is a graph illustrating results of an X-ray diffraction (XRD) analysis of a fluoride phosphor according to an exemplary embodiment of the present inventive concept.

FIG. 2A is a graph illustrating results of an X-ray diffraction (XRD) analysis of a fluoride phosphor according to an exemplary embodiment of the present inventive concept.

Referring to FIG. 1, the fluoride phosphor according to an exemplary embodiment of the present inventive concept exhibited a crystal peak in XRD, identical to that of a powder of $K_2SiF_6$. Thus, it could be confirmed that a fluoride phosphor having a structure of $K_2SiF_6$ was manufactured.

Figure 2B:
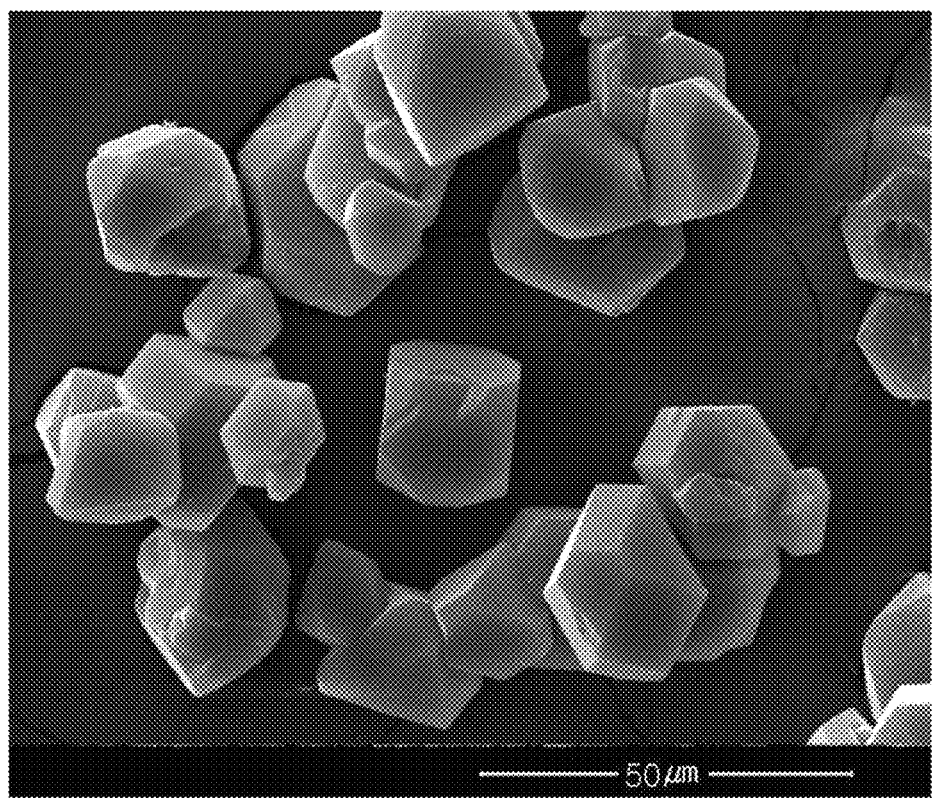
FIG. 2B is a scanning electron micrograph of the fluoride phosphor according to an exemplary embodiment of the present inventive concept.

FIG. 2B is a scanning electron micrograph of the fluoride phosphor according to an exemplary embodiment of the present inventive concept.

Referring to FIG. 2, the fluoride phosphor according to an exemplary embodiment of the present inventive concept may include particles having cubic shapes and have a particle size of 15 μm to 25 μm.

Table 1 shows amounts of $Mn^{4+}$ contained within the manufactured fluoride phosphors, particle sizes, and phosphor characteristics.

Referring to Table 1, the fluoride phosphor according to the inventive example has a minimum amount of $Mn^{4+}$, and has an atomic fraction of approximately, 1.2 at. %. The fluoride phosphors according to the comparative examples 1 and 2 have concentrations of $Mn^{4+}$, higher than that of the inventive example and have atomic fractions of 2.4 at. % and 3.0 at. %, respectively.

In the comparative examples 1 and 2 and the inventive example, particle sizes of phosphor particles were approximately 20 μm, similar to each other. In terms of absorptivity, the comparative example 2 and the inventive example exhibited slight low values as compared to comparative example 1. In terms of internal quantum efficiency (IQE), the comparative example 2 and the inventive example exhibited higher values than that of comparative example 1.

TABLE 1

|  | Amount of $Mn^{4+}$ | Particle Size (median) | Absorptivity | IQE |
| --- | --- | --- | --- | --- |
| Comparative Example 1 | 3.02 at. % | 19.6 μm | 0.73 | 0.80 |
| Comparative Example 2 | 2.42 at. % | 20.9 μm | 0.64 | 0.85 |
| Inventive Example | 1.21 at. % | 20.1 μm | 0.62 | 0.85 |

According to Table 1, in the phosphor according to an exemplary embodiment of the present inventive concept, the amount of $Mn^{4+}$, an activator, may be decreased while the particle size and absorptivity may be maintained on levels similar to those of the comparative examples, and IQE may be secured. In a case in which the concentration of $Mn^{4+}$ is decreased and the particle size is reduced, phosphor characteristics may be deteriorated, while in a case in which the particle size of the phosphor is relatively large, it may be difficult to implement a process of dispersing phosphors at the time of manufacturing alight emitting device. Thus, the fluoride phosphor according to an exemplary embodiment of the present inventive concept may be manufactured to have a particle size of 15 μm to 25 μm.

Figure 3:
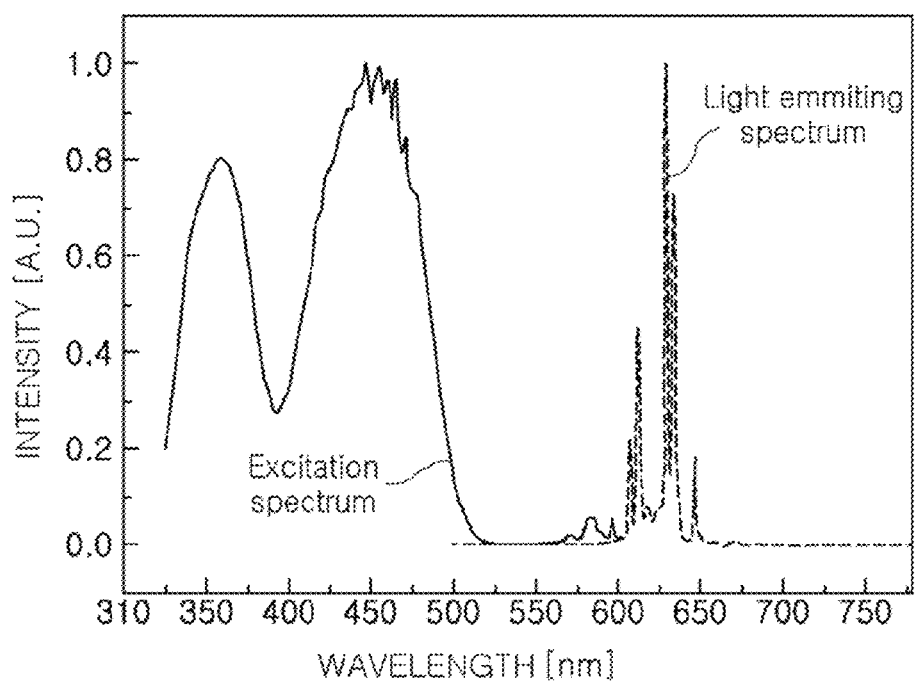
FIG. 3 is a graph illustrating an excitation spectrum and a light emitting spectrum of the fluoride phosphor according to an exemplary embodiment of the present inventive concept.

FIG. 3 is a graph illustrating an excitation spectrum and a light emitting spectrum of the fluoride phosphor according to an exemplary embodiment of the present inventive concept.

Referring to FIG. 3, the fluoride phosphor according to an exemplary embodiment of the present inventive concept may have high excitation efficiency in a wavelength range of approximately 340 nm to 380 nm and approximately 420 nm to 470 nm and in particular, have the maximum excitation efficiency at a wavelength of approximately 454. In this case, a light emitting wavelength had a range of 620 nm to 640 nm corresponding to a red wavelength band and in particular, a light emitting peak was exhibited at a wavelength of approximately 631 nm. The fluoride phosphor exhibited a narrow full width at half maximum (FWHM) of 10 nm or less.

Figure 4:
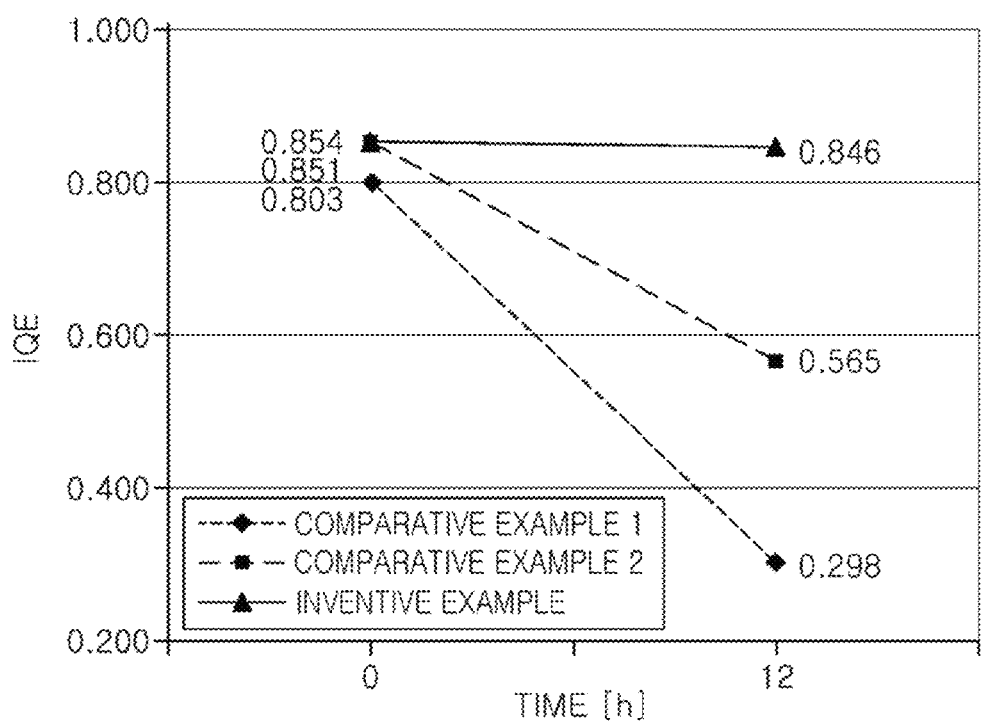
FIG. 4 is a graph illustrating light emitting characteristics of the fluoride phosphor according to an exemplary embodiment of the present inventive concept.

FIG. 4 is a graph illustrating light emitting characteristics of the fluoride phosphor according to an exemplary embodiment of the present inventive concept.

Referring to FIG. 4, preservation test results of fluoride phosphors manufactured under high temperature and humidity conditions are confirmed. Specifically, the fluoride phosphors were preserved in power state under a temperature of 85° C. and a humidity of 85%.

As a result of performing preservation tests on the inventive example and the comparative examples 1 and 2 as described above, after 12 hours had elapsed, values of IQE were drastically decreased. However, in the fluoride phosphor according to the exemplary embodiment of the present inventive concept, IQE was hardly decreased and was maintained at a level of 84.6%, relatively high.

The reason for this is that the fluoride phosphor according to the exemplary embodiment of the present inventive concept has a relatively low amount of Mn as compared to the comparative examples. $K_2SiF_6:Mn^{4+}$ may react with moisture as in the following reaction formula 1.

$$20K_2Si_{0.9}Mn_{0.1}F_6 + 8H_2O \rightarrow 18K_2SiF_6 + 2KMnO_4 + 2KHF_2 + 8HF + 3H_2 \quad \text{[Reaction Formula 1]}$$

As in reaction formula 1, Mn contained within the fluoride phosphor may react with moisture to an oxide ($KMnO_4$), thereby deteriorating phosphor characteristics. Thus, in a case in which the amount of Mn is relatively low as in the case of the fluoride phosphor according to the exemplary embodiment of the present inventive concept, characteristics of the fluoride phosphor vulnerable to moisture may be improved.

Figure 5:
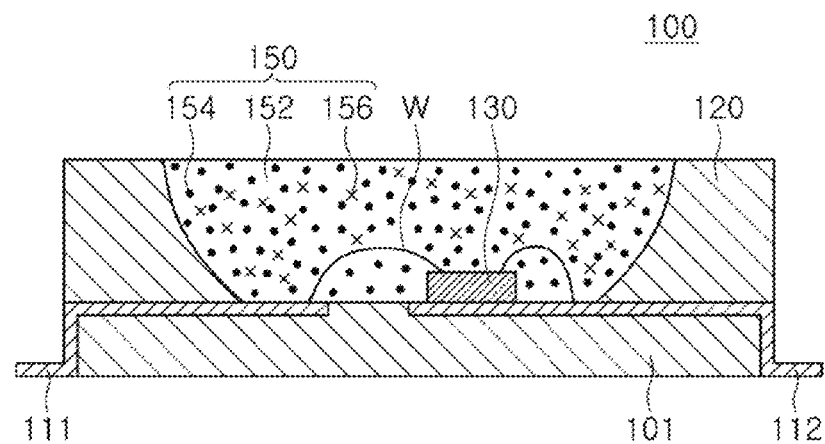
FIG. 5 is a schematic cross-sectional view of a light emitting device according to an exemplary embodiment of the present inventive concept.

FIG. 5 is a schematic cross-sectional view of a light emitting device according to an exemplary embodiment of the present inventive concept.

Referring to FIG. 5, a light emitting device 100 may include a substrate 101, and a light emitting element 130 and a wavelength conversion part 150 disposed on the substrate 101. The light emitting device 100 may include a pair of lead frames 111 and 112 electrically connected to the light emitting element 130, a body part 120 having a cup shape, and conductive wires W connecting the light emitting element 130 to the lead frames 111 and 112. Thus, the light emitting device 100 may configure a light emitting element package.

The substrate 101 may be formed using an opaque resin or a resin having a high degree of reflectance, and may be formed of a polymer resin facilitating an injection process. The substrate 101 may be formed of a ceramic material and in this case, the emission of heat may be facilitated. Depending on exemplary embodiments, the substrate 101 may be a printed circuit board provided with a wiring pattern.

The pair of lead frames 111 and 112 may be disposed on the substrate 101 and may be electrically connected to the light emitting element 130 in order to apply driving power to the light emitting element 130. The lead frames 111 and 112 may be electrically connected to the light emitting element 130 through the conductive wires W and may be used as terminals for applying an external electrical signal to the light emitting element 130. To this end, the lead frames 111 and 112 may be formed of a metal having excellent conductivity. Depending on exemplary embodiments, the light emitting element 130 may come into direct contact with and may be connected to the lead frames 111 and 112 without the conductive wires W.

The body part 120 may form a cavity disposed in the substrate 101 and the lead frames 111 and 112 and receiving the light emitting element 130 therein. The body part 120 may have a cup shape so as to allow improvements in reflection efficiency of light, but is not limited thereto. Depending on exemplary embodiments, the body part 120 may be formed integrally with the substrate 101 to configure a package body.

The light emitting element 130 may be an electroluminescent device disposed on an upper surface of the substrate 101 and emitting light when an electrical signal is applied thereto. The light emitting element 130 may emit blue light. For example, the light emitting element 130 may be a semiconductor light emitting element including an epitaxial grown semiconductor layer. The light emitting element 130 may be a nano light emitting element including a plurality of light emitting nanostructures.

The wavelength conversion part 150 may be disposed within the cavity of the body part 120 and include an encapsulating layer 152 and a fluoride phosphor 154 and a green phosphor 156 dispersed within the encapsulating layer 152. The fluoride phosphor 154 may be the fluoride phosphor according to an exemplary embodiment of the present inventive concept. The wavelength conversion part 150 may be excited by excitation light emitted by the light emitting element 130 and emit wavelength-converted visible light. For example, the fluoride phosphor 154 and the green phosphor 156 may be excited by blue light emitted by the light emitting element 130 to thereby emit red light and green light, respectively. The encapsulating layer 152 may be formed of a light transmissive resin, for example, epoxy, silicone, modified silicone, urethane resin, oxetane resin, acrylics, polycarbonate, polyimide and combinations thereof.

In the exemplary embodiment, since the fluoride phosphor 154 has a low amount of Mn, characteristics thereof may be ensured with respect to moisture. Thus, even without a separate coating layer or a member protecting the wavelength conversion part, reliability may be secured to allow for a simplified process.

Figure 6:
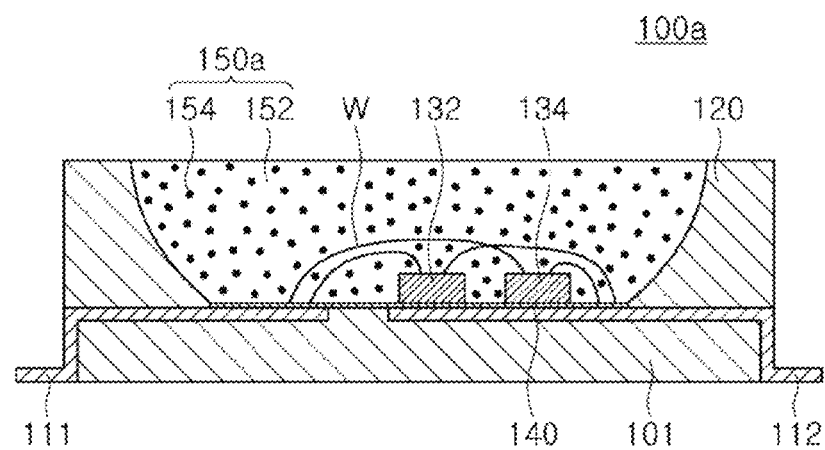
FIG. 6 is a schematic cross-sectional view of a light emitting device according to an exemplary embodiment of the present inventive concept.

FIG. 6 is a schematic cross-sectional view of a light emitting device according to an exemplary embodiment of the present inventive concept.

Referring to FIG. 6 a light emitting device 100a may include the substrate 101, and first and second light emitting elements 132 and 134, a protective layer 140 and a wavelength conversion part 150a disposed on the substrate 101. The light emitting device 100a may include the pair of lead frames 111 and 112 electrically connected to the first and second light emitting elements 132 and 134, the body part 120 having a cup shape, and the conductive wires W connecting the first and second light emitting elements 132 and 134 to the lead frames 111 and 112.

Unlike the exemplary embodiment of FIG. 5, in the light emitting device 100a according to the exemplary embodiment, two light emitting elements like the first and second light emitting elements 132 and 134 may be mounted on the substrate 101. The first and second light emitting elements 132 and 134 may emit light having different wavelengths. For example, the first light emitting element 132 may emit green light and the second light emitting element 134 may emit blue light. Accordingly, the wavelength conversion part 150a may merely include the encapsulating layer 152 and the fluoride phosphor 154 according to the exemplary embodiment of the present inventive concept.

The protective layer 140 may be disposed on at least one surface of the wavelength conversion part 150a. In the exemplary embodiment, the protective layer 140 may be disposed on a lower surface of the wavelength conversion part 150a, that is, between the wavelength conversion part 150a and the substrate 101, but the protective layer 140 may be disposed in various manners depending on embodiments. For example, the protective layer 140 may be disposed on all of upper and lower surfaces of the wavelength conversion part 150a or may be disposed to encapsulate the entirety of the wavelength conversion part 150a.

The protective layer 140 may protect the fluoride phosphor 154 from external environmental factors, in particular, moisture to secure reliability of the light emitting device 100a. Thus, the protective layer 140 may be formed of a waterproofing or damp proofing material capable of preventing the infiltration of moisture, and a thickness of the protective layer 140 is not limited to that illustrated in FIG. 6. In the light emitting device 100a according to the exemplary embodiment of the present inventive concept, the fluoride phosphor 154 may have a relatively small amount of Mn, such that characteristics thereof vulnerable to moisture may be improved. Further, the protective layer 140 may be additionally used, whereby reliability of the light emitting device 100a may be further improved. However, since the protective layer 140 is a selective constitution, it may be omitted depending on embodiments.

The protective layer 140 may be formed of a resin material, for example, epoxy, silicone, modified silicone, urethane resin, oxetane resin, acrylics, polycarbonate, polyimide and the like. In this case, a refractive index of the protective layer 140 may be different from that of the encapsulating layer 152, such that light extraction efficiency may be improved. Alternatively, the protective layer 140 may be a coating layer formed of a fluorine-based or silica-based coating agent.

Figure 7:
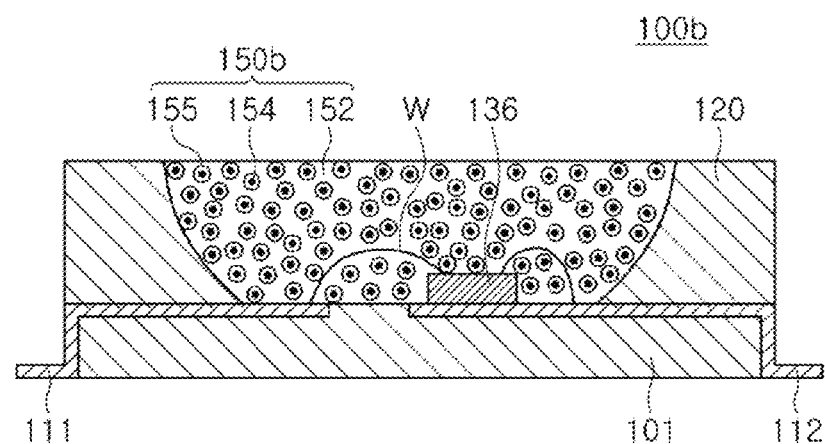
FIG. 7 is a schematic cross-sectional view of a light emitting device according to an exemplary embodiment of the present inventive concept.

FIG. 7 is a schematic cross-sectional view of a light emitting device according to an exemplary embodiment of the present inventive concept.

Referring to FIG. 7, a light emitting device 100b may include the substrate 101, and a light emitting element 136 and a wavelength conversion part 150b disposed on the substrate 101. The light emitting device 100b may include the pair of lead frames 111 and 112 electrically connected to the light emitting element 136, the body part 120 having a cup shape, and the conductive wires W connecting the light emitting element 136 to the lead frames 111 and 112.

Unlike the exemplary embodiment of FIG. 5, the light emitting element 136 of the light emitting device 100b according to the exemplary embodiment may simultaneously emit green light and blue light. For example, the light emitting element 136 may be a semiconductor light emitting element including an epitaxial grown semiconductor layer. Or, the light emitting element 136 may be a nano light emitting element including a plurality of light emitting nanostructures. A structure of the light emitting element 136 will be described in detail with reference to FIGS. 8A and 8B.

Unlike the exemplary embodiments of FIGS. 5 and 6, the wavelength conversion part 150b of the light emitting element 100b according to the exemplary embodiment may include the encapsulating layer 152, the fluoride phosphors 154 dispersed within the encapsulating layer 152, and a coating layer 155 enclosing the fluoride phosphor 154. The coating layer 155 may cover the entirety of a particle surface of the fluoride phosphor 154.

The coating layer 155 may be formed of an organic material or an inorganic material. In a case in which the coating layer 155 is formed of an inorganic material, the coating layer 155 may be formed of a silicon oxide, a metal oxide, or a fluorine material. For example, the coating layer 155 may be formed of at least one from among $SiO_2$, $Al_2O_3$, ZnO, $TiO_2$, and $K_2SiF_6$. In a case in which the coating layer 155 is formed of an organic material, the coating layer 155 may be formed using, for example, an acetic acid, a stearic acid, a myristic acid, a lauric acid or the like, in particular, a long-chain n-alkyl carboxylic acid, where n is greater than 6.

According to the exemplary embodiment, the particle surface of the fluoride phosphor 154 is covered with the coating layer 155 to effectively block external moisture, whereby reliability of the light emitting device 100b may be further improved. In addition, since the fluoride phosphor 154 according to the exemplary embodiment of the present inventive concept may have a relatively small amount of Mn, such that characteristics thereof vulnerable to moisture may be improved, a thickness of the coating layer 155 may be relatively reduced and if necessary, the coating layer 155 may be omitted.

Figure 8A:
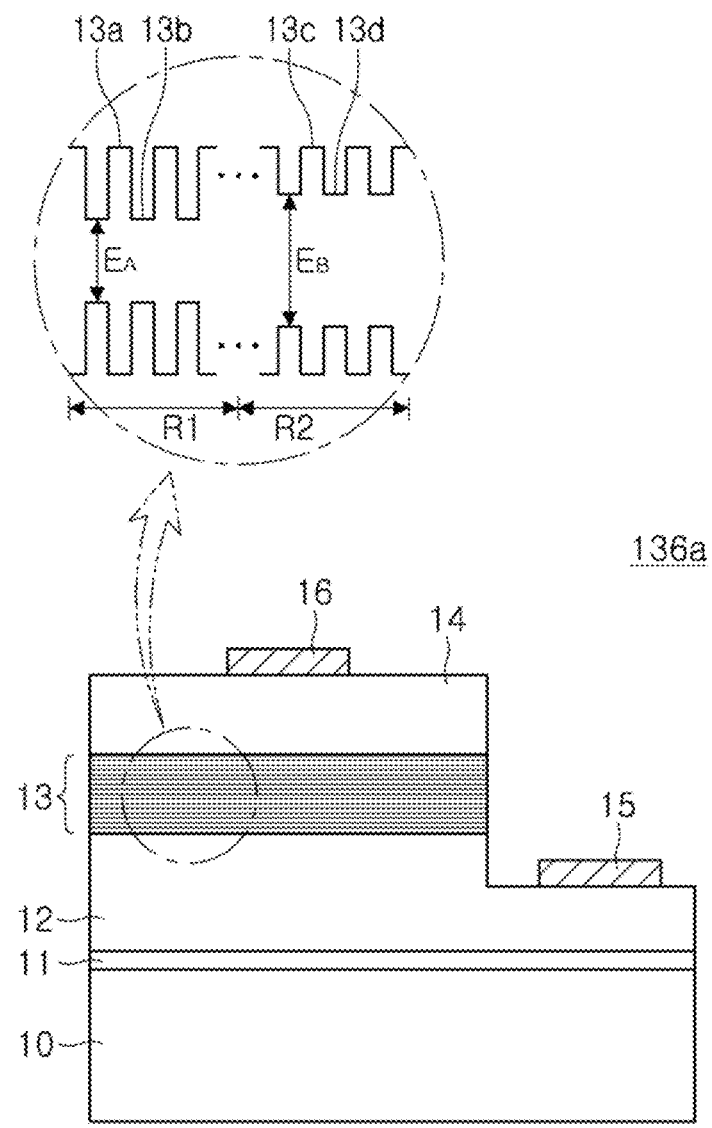
FIGS. 8A and 8B are schematic cross-sectional views of light emitting elements employable in the light emitting device according to an exemplary embodiment of the present inventive concept.
Figure 8B:
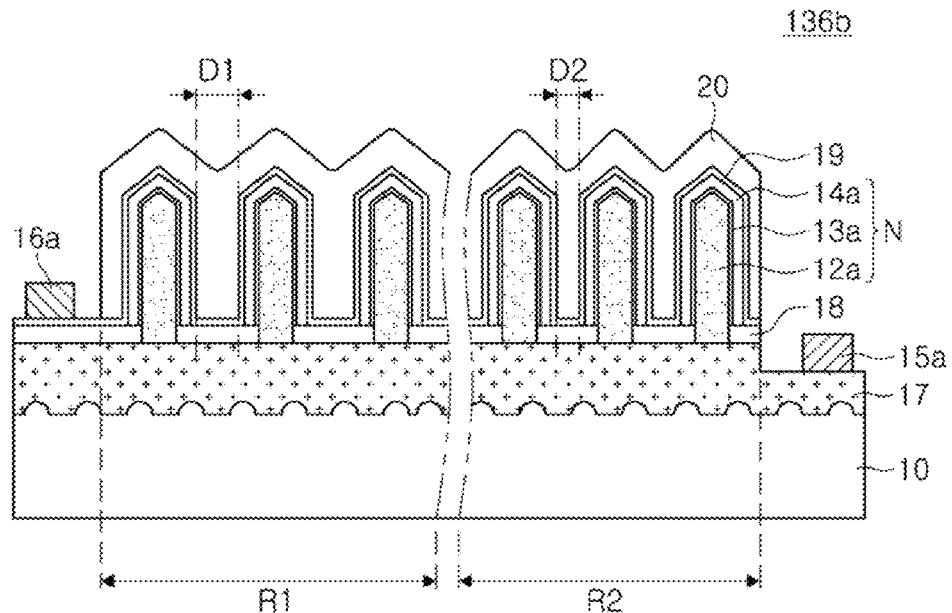

FIGS. 8A and 8B are schematic cross-sectional views of light emitting elements employable in the light emitting device according to an exemplary embodiment of the present inventive concept. Specifically, FIGS. 8A and 8B illustrate light emitting elements applicable to the exemplary embodiment of FIG. 7.

Referring to FIG. 8A, a light emitting element 136a may include an element substrate 10, a buffer layer 11, a first conductivity type semiconductor layer 12, an active layer 13, and a second conductivity type semiconductor layer 14 disposed on the element substrate 10, and may further include first and second electrodes 15 and 16. The active layer 13 may include quantum barrier layers 13a and 13c and quantum well layers 13b and 13d.

The element substrate 10 may be provided as a semiconductor growth substrate formed of an insulating material, a conductive material or a semiconductor material such as sapphire, SiC, $MgAl_2O_4$, MgO, $LiAlO_2$, $LiGaO_2$, GaN, or the like. Depending on exemplary embodiments, a plurality of unevenness structures may be formed on an upper surface of the element substrate 10, that is, a growth surface of semiconductor layers and due to such unevenness structures, crystalline properties and light emission efficiency of the semiconductor layers may be improved.

The buffer layer 11 may alleviate stress acting on the first conductivity type semiconductor layer 12 to improve crystalline properties and may be formed of AlN, GaN or AlGaN. However, the buffer layer 11 is not an essential component and depending on exemplary embodiments, may be omitted.

The first and second conductivity type semiconductor layers 12 and 14 may be semiconductor layers doped with an n-type impurity and a p-type impurity, respectively, but are not limited thereto. In a reversed manner, the first and second conductivity type semiconductor layers 12 and 14 may be semiconductor layers doped with a p-type impurity and an n-type impurity, respectively. The first and second conductivity type semiconductor layers 12 and 14 may be formed of a material having a composition of $Al_xIn_yGa_{1-x-y}N$ ($0 \leq x \leq 1$, $0 \leq y \leq 1$, $0 \leq x+y \leq 1$). Each of the layers may be formed as a single layer but may be formed to include a plurality of layers having different characteristics in terms of a doping concentration, a composition and the like. However, in addition to a nitride semiconductor, the first and second conductivity type semiconductor layers 12 and 14 may be formed using an AlInGaP or AlInGaAs-based semiconductor.

The active layer 13 disposed between the first and second conductivity type semiconductor layers 12 and 14 may emit light having a predetermined amount of energy by recombination of electrons and holes, and may have a multi-quantum well (MQW) structure in which the quantum barrier layers 13a and 13c and the quantum well layers 13b and 13d are alternately stacked. For example, the active layer 13 is formed of a nitride semiconductor, a structure of GaN/InGaN may be used. In particular, in a light emitting element 130a according to the exemplary embodiment, the active layer 13 may include first and second regions R1 and R2. A level of band gap energy $E_A$ of the quantum well layer 13b in the first region R1 may be lower than a level of band gap energy $E_B$ of the quantum well layer 13d in the second region R2. Such a difference in levels of band gap energy may be adjusted by a composition of the quantum well layer 13b, for example, the content of indium (In). In accordance with an increase in the content of indium (In), the level of band gap energy may be decreased. Thus, the first region R1 may emit green light and the second region R2 may emit blue light and accordingly, the light emitting element 130a may emit all of green light and blue light from a single active layer 13.

The first and second electrodes 15 and 16 may be electrically connected to the first and second conductivity type semiconductor layers 12 and 14, respectively. The first and second electrodes 15 and 16 may be formed of an electrical conductive material, for example, at least one of Ag, Al, Ni, Cr and the like. Depending on embodiments, the first and second electrodes 15 and 16 may be transparent electrodes and may be formed of, for example, indium tin oxide (ITO), aluminum zinc oxide (AZO), indium zinc oxide (IZO), ZnO, GZO(ZnO:Ga), $In_2O_3$, $SnO_2$, CdO, $CdSnO_4$, or $Ga_2O_3$. Positions and shapes of the first and second electrodes 15 and 16 illustrated in FIG. 8A are provided by way of example, and may be variously changed depending on embodiments.

Referring to FIG. 8B, a light emitting element 136b may include the element substrate 10, and a first conductivity type semiconductor base layer 17, an insulating layer 18, light emitting nanostructures N, a transparent electrode layer 19, and a filling layer 20 disposed on the element substrate 10. Each of the light emitting nanostructures N may include a first conductivity type semiconductor core 12a, an active layer 13a, and a second conductivity type semiconductor layer 14a formed and grown from the first conductivity type semiconductor base layer 17. The light emitting element 136b may further include first and second electrodes 15a and 16a electrically connected to the first conductivity type semiconductor base layer 17 and the second conductivity type semiconductor layer 14a, respectively.

The element substrate 10 may be provided as a semiconductor growth substrate.

The first conductivity type semiconductor base layer 17 may be disposed on the element substrate 10. The first conductivity type semiconductor base layer 17 may be formed of a group III-V compound, for example, GaN. The first conductivity type semiconductor base layer 17 may be formed of, for example, n-GaN doped with an n-type impurity. In the exemplary embodiment, the first conductivity type semiconductor base layer 17 may provide a crystal plane for growing the first conductivity type semiconductor core 12a of the light emitting nanostructure N thereon and may be connected to one sides of the respective light emitting nanostructures N in common, thereby serving as a contact electrode.

The insulating layer 18 may be disposed on the first conductivity type semiconductor base layer 17. The insulating layer 18 may be formed of a silicon oxide or a silicon nitride, for example, at least one of $SiO_x$, $SiO_xN_y$, $Si_xN_y$, $Al_2O_3$, TiN, AlN, ZrO, TiAlN, and TiSiN. The insulating layer 18 may include a plurality of openings exposing portions of the first conductivity type semiconductor base layer 17. Diameters, lengths, positions and growth conditions of the light emitting nanostructures N may be determined depending on sizes of the plurality of openings. The plurality of openings may have various shapes such as circular shapes, quadrangular shapes, hexagonal shapes or the like.

The plurality of light emitting nanostructures N may be respectively disposed in positions corresponding to the plurality of openings. Each of the plurality of light emitting nanostructures N may have a core-shell structure including the first conductivity type semiconductor core 12a grown from each of regions of the first conductivity type semiconductor base layer 17 exposed through the plurality of openings, and the active layer 13a and the second conductivity type semiconductor layer 14a sequentially formed on a surface of the first conductivity type semiconductor core 12a. In addition, FIG. 8B illustrates a case in which a width of the first conductivity type semiconductor core 12a is identical to that of each opening of the insulating layer 18, but it merely provided by way of example. The width of the first conductivity type semiconductor core 12a may be formed to be greater than that of the opening.

The first conductivity type semiconductor core 12a and the second conductivity type semiconductor layer 14a may be formed of semiconductor layers doped with an n-type impurity and a p-type impurity, respectively, but are not limited thereto. In a reversed manner, the first conductivity type semiconductor core 12a and the second conductivity type semiconductor layer 14a may be formed of semiconductor layers doped with a p-type impurity and an n-type impurity, respectively. The active layer 13a may be disposed on the surface of the first conductivity type semiconductor core 12a. The active layer 13a may emit light having a predetermined amount of energy by recombination of electrons and holes, and may be a layer formed of a single material such as InGaN or the like, but may have a single quantum well structure or a multi-quantum well (MQW) structure in which quantum barrier layers and quantum well layers are alternately stacked.

In particular, the light emitting element 136b according the exemplary embodiment may include first and second regions R1 and R2, and a distance D1 between the light emitting nanostructures N adjacent to each other in the region R1 may be greater than a distance D2 between the light emitting nanostructures N adjacent to each other in the region R2. Due to the different distances, for example, the content of indium (In), an impurity doped in the active layer 13a during the formation of the active layer 13a, may be varied, whereby the first and second regions R1 and R2 may emit light having different wavelengths. For example, the first region R1 may emit green light and the second region R2 may emit blue light and accordingly, the light emitting element 136b may emit all of green light and blue light.

The number of the light emitting nanostructures N included in the light emitting element 136b is not limited to that illustrated in the drawings. For example, the light emitting element 136b may include several tens to several millions of the light emitting nanostructures N. Each of the light emitting nanostructures N according to the exemplary embodiment may have a lower region having a hexagonal prismatic shape and an upper region having a hexagonal pyramid shape. Depending on embodiments, the light emitting nanostructure N may have a pyramid shape or a pillar shape. Since the light emitting nanostructure N has a three-dimensional shape as described above, a light emitting surface area may be relatively large to thereby allow for an increase in light efficiency.

The transparent electrode layer 19 may be electrically connected to the second conductivity type semiconductor layer 14a. The transparent electrode layer 19 may cover upper surfaces and side surfaces of the light emitting nanostructures N and may be disposed such that portions thereof between the light emitting nanostructures N adjacent to each other may be connected to each other. The transparent electrode layer 19 may be formed of, for example, indium tin oxide (ITO), aluminum zinc oxide (AZO), indium zinc oxide (IZO), ZnO, GZO(ZnO:Ga), $In_2O_3$, $SnO_2$, CdO, $CdSnO_4$, or $Ga_2O_3$.

The filling layer 20 may be disposed on the light emitting nanostructures N and the transparent electrode layer 19. The filling layer 20 may fill a space between the light emitting nanostructures N adjacent to each other and may be disposed to cover the light emitting nanostructures N and the transparent electrode layer 19 disposed on the light emitting nanostructures N. Depending on embodiments, an upper surface of the filling layer 20 may be bent according to the light emitting nanostructures N. The filling layer 20 may be formed of an insulating and light-transmitting material and for example, may contain $SiO_2$, $SiN_x$, $Al_2O_3$, HfO, $TiO_2$ or ZrO.

The first and second electrodes 15a and 16a may be disposed on the first conductivity type semiconductor base layer 17 and the transparent electrode layer 19 at one sides of the light emitting element 136b so as to be electrically connected to the first conductivity type semiconductor base layer 17 and the second conductivity type semiconductor layer 14a, respectively. The first and second electrodes 15a and 16a may have a structure including a single layer or a multiple layer of conductive material. For example, the first and second electrodes 15a and 16a may contain at least one of Au, Ag, Cu, Zn, Al, In, Ti, Si, Ge, Sn, Mg, Ta, Cr, W, Ru, Rh, Ir, Ni, Pd, and the like or alloys thereof. However, dispositions and shapes of the first and second electrodes 15a and 16a are provided by way of example and may be variously changed depending on embodiments.

Figure 9:
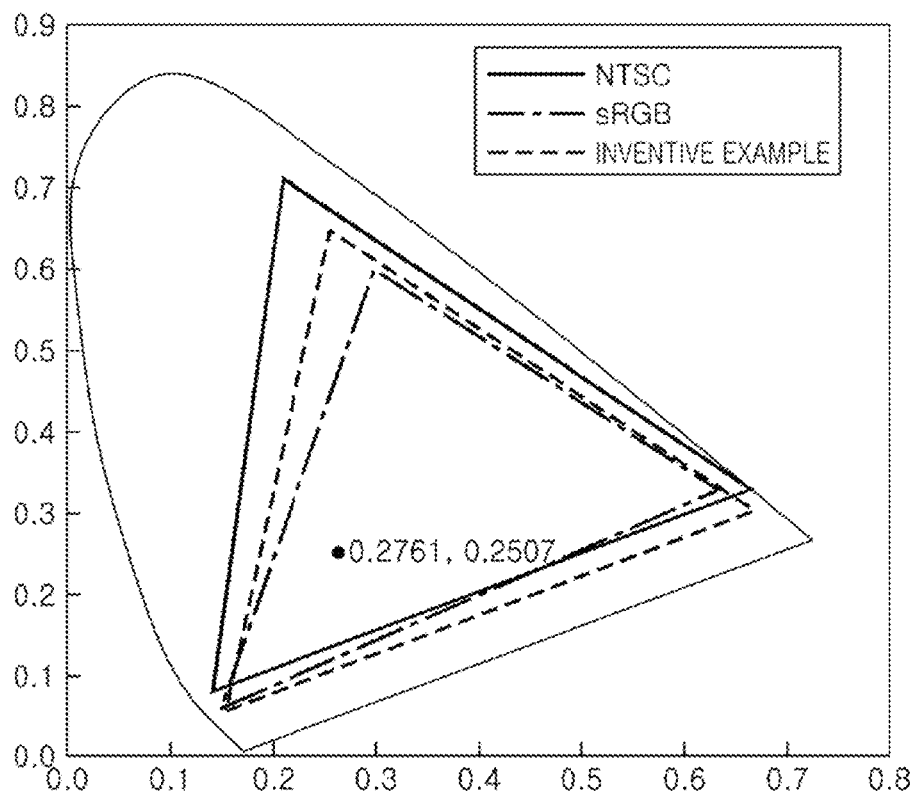
FIG. 9 illustrates the CIE 1931 color coordinates for explaining color characteristics obtained from a white light emitting device using the fluoride phosphor according to an exemplary embodiment of the present inventive concept.

FIG. 9 illustrates the CIE 1931 color coordinates for explaining color characteristics obtained from a white light emitting device using the fluoride phosphor according to an exemplary embodiment of the present inventive concept.

Referring to FIG. 9, a white light emitting device according to an exemplary embodiment of the present inventive concept may include a light emitting element emitting blue light having a wavelength of 446 nm, a β-SiAlON phosphor emitting green light having a peak wavelength of approximately 533 nm, and the fluoride phosphor emitting red light according to the exemplary embodiment of the present inventive concept. Hereinafter, unless explicitly described otherwise, the white light emitting device according to an exemplary embodiment of the present inventive concept may have such a configuration.

The white light emitting device may emit white light having color coordinates (0.2761, 0.2507). Area ratios to NTSC and sRGB standards are 89.41% and 99.95%, respectively, and exhibited high levels of color reproducibility.

Figure 10A:
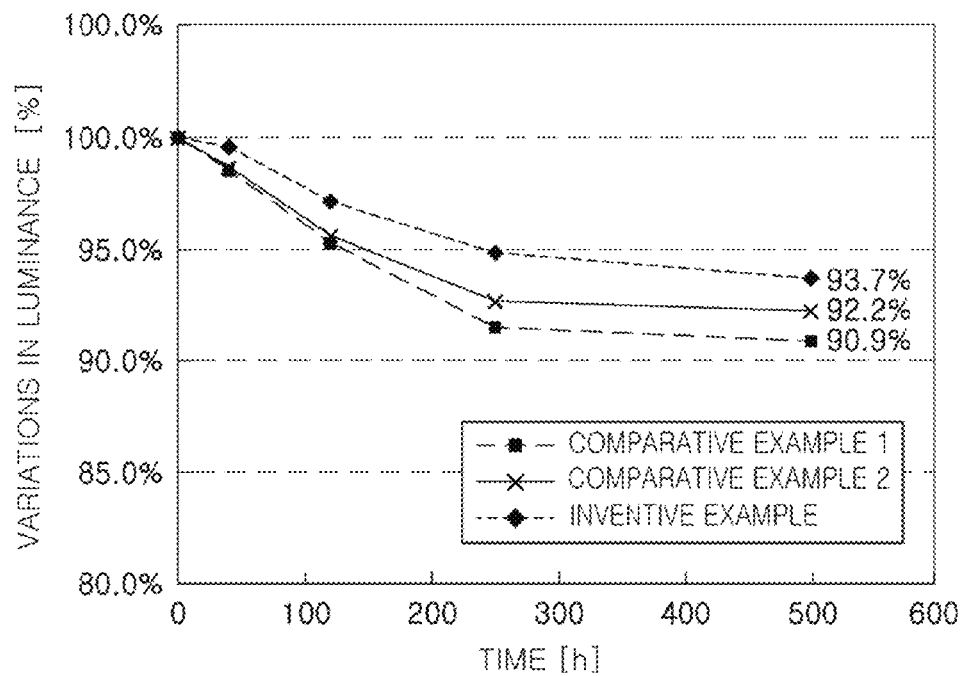
FIGS. 10A and 10B are graphs illustrating reliability characteristics of the white light emitting device using the fluoride phosphor according to an exemplary embodiment of the present inventive concept.
Figure 10B:
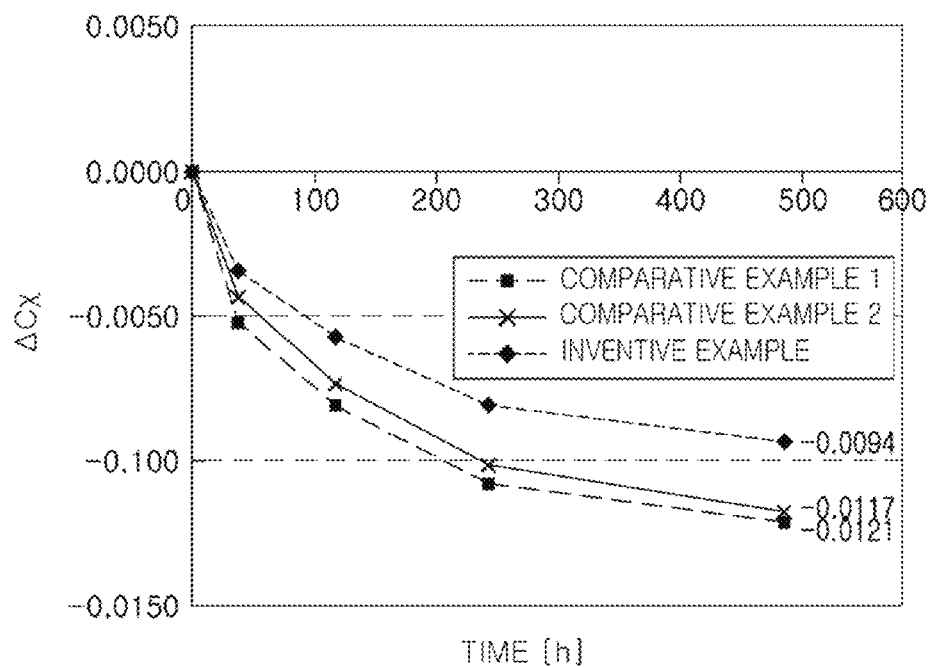

FIGS. 10A and 10B are graphs illustrating reliability characteristics of the white light emitting device using the fluoride phosphor according to an exemplary embodiment of the present inventive concept.

FIGS. 10A and 10B show operational characteristics of the white light emitting devices and each indicate variations in luminance and ΔCx, which refers to degrees of shift of color coordinates over time. Referring to FIGS. 10A and 10B, tests were performed under operational conditions of 6 V and 150 mA at a temperature of 85° C. and a humidity of 85%.

In terms of variations in luminance based on an initial level of luminance being 100%, after 500 hours have elapsed, levels of luminance were degraded to 90.9% and 92.2% in the comparative example 1 and the comparative example 2, respectively, while the level of luminance was degraded to 93.7% by an amount of approximately 6.3% and relatively high reliability characteristics were exhibited in the inventive example. In terms of ΔCx, after 500 hours have elapsed, variations were made by degrees of −0.0121 and −0.0117 in the comparative example 1 and the comparative example 2, respectively, while a relatively low variation, −0.0094, was made in the inventive example.

Figure 11A:
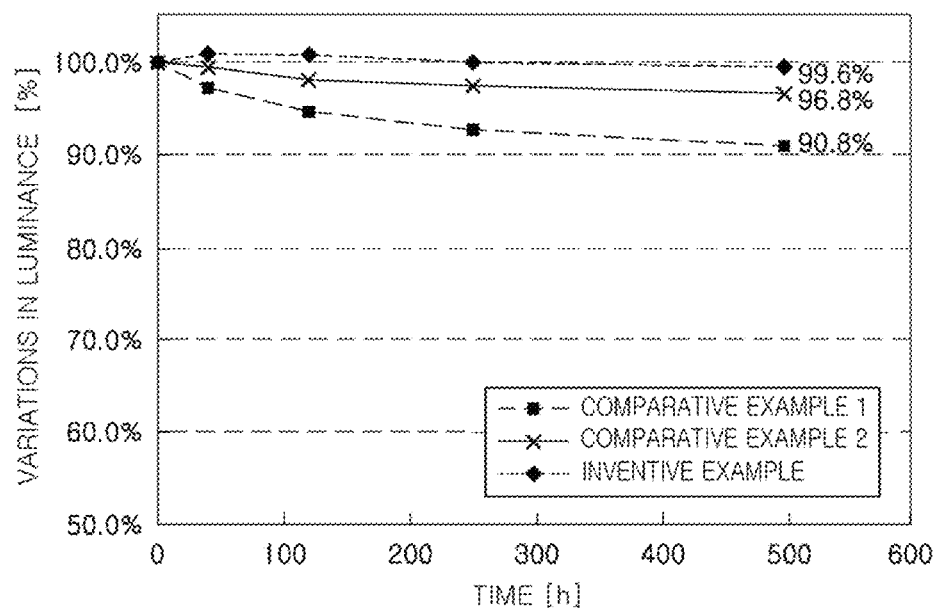
FIGS. 11A and 11B are graphs illustrating reliability characteristics of the white light emitting device using the fluoride phosphor according to an exemplary embodiment of the present inventive concept.
Figure 11B:
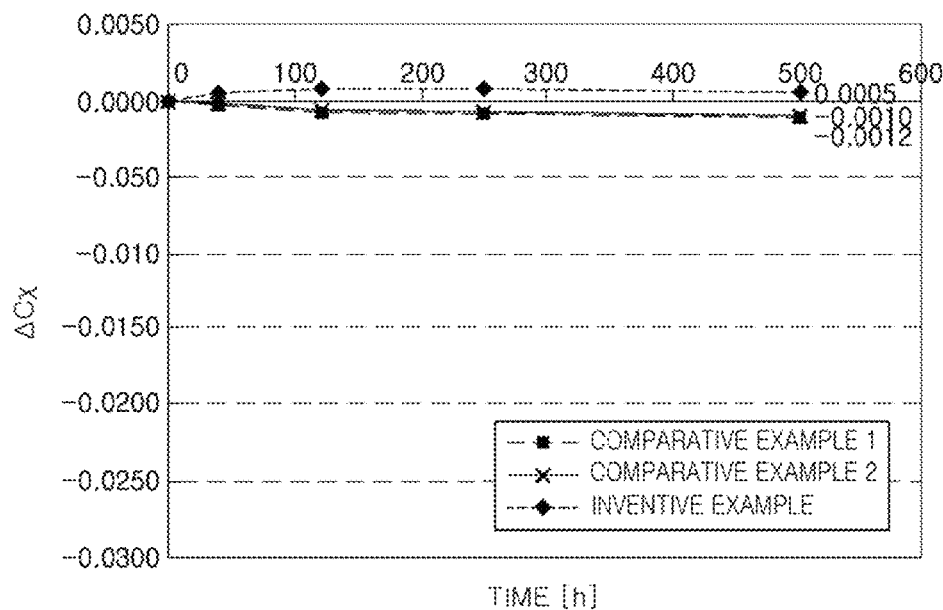

FIGS. 11A and 11B are graphs illustrating reliability characteristics of the white light emitting device using the fluoride phosphor according to an exemplary embodiment of the present inventive concept.

FIGS. 11A and 11B illustrate preservation characteristics, that is, OFF-state characteristics of the white light emitting device and each indicate variations in luminance and ΔCx, which refers to degrees of shift of color coordinates over time. Referring to FIGS. 11A and 11B, tests were performed at a temperature of 85° C. and a humidity of 85%.

In terms of variations in luminance based on an initial level of luminance being 100%, after 500 hours have elapsed, levels of luminance were degraded to 90.8% and 96.8 in the comparative example 1 and the comparative example 2, respectively, while the level of luminance was degraded to 99.6% by an amount of approximately 0.4% and relatively high reliability characteristics were exhibited in the inventive example. In terms of ΔCx, after 500 hours have elapsed, variations were made by degrees of −0.0012 and −0.0010 in the comparative example 1 and the comparative example 2, respectively, while a relatively low variation, 0.0005, was made in the inventive example. In particular, in the case of ΔCx, the comparative example 1 and the comparative example 2 exhibited similar levels of deterioration rate, while the inventive example exhibited remarkably superior characteristics, as illustrated in FIGS. 10B and 11B. Thus, in a case in which Mn is contained in an amount of less than approximately 2.0 at. %, in particular, less than 1.5 at. %, it could be confirmed that reliability may be confirmed.

Figure 12:
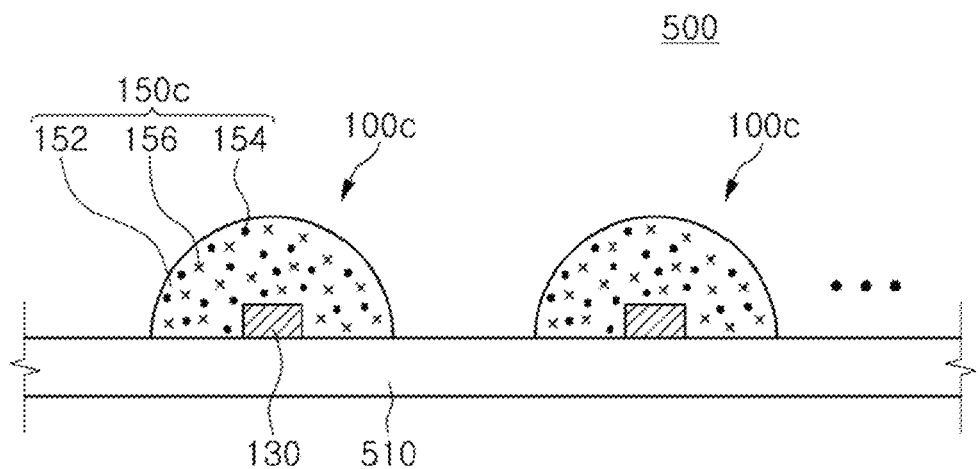
FIGS. 12 and 13 are schematic cross-sectional views each illustrating a white light source module according to an exemplary embodiment of the present inventive concept.
Figure 13:
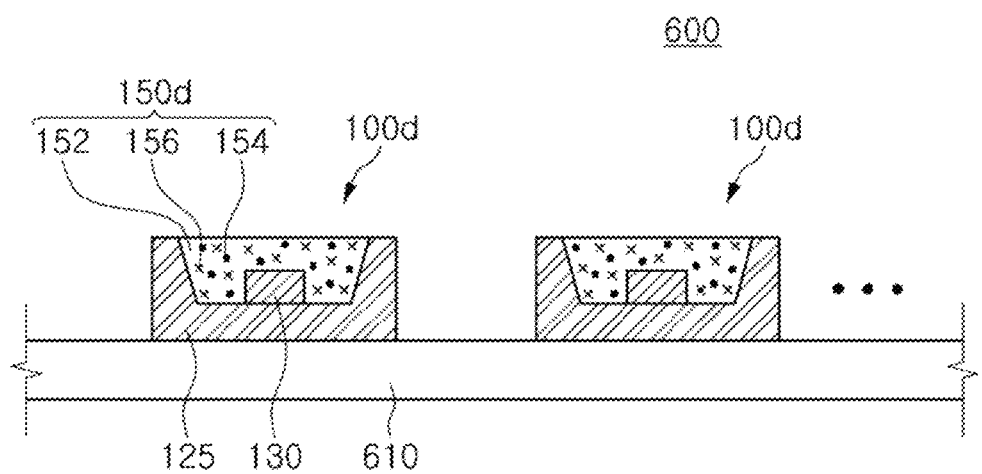

FIGS. 12 and 13 are schematic cross-sectional views each illustrating a white light source module according to an exemplary embodiment of the present inventive concept.

Referring to FIG. 12, a light source module 500 for an LCD backlight unit may include a circuit board 510 and an arrangement of a plurality of white light emitting devices 100c mounted on the circuit board 510. An upper surface of the circuit board 510 may be provided with conductive patterns connected to the white light emitting devices 100c.

Unlike the light emitting device described with reference to FIG. 5, each of the white light emitting devices 100c may have a structure in which the light emitting element 130 emitting blue light is directly mounted on the circuit board 510 through the COB (chip on board) scheme. Each white light emitting device 100c may not have a separate reflecting wall and may include a wavelength conversion part 150c having a hemispherical shape while functioning as a lens part to thereby allow for a wide orientation angle. Such a wide orientation angle may contribute to a reduction in a thickness or a width of an LCD display.

Referring to FIG. 13, a light source module 600 for an LCD backlight unit may include a circuit board 610 and an arrangement of a plurality of white light emitting devices 100d mounted on the circuit board 610. Each of the white light emitting devices 100d may include the light emitting element 130 mounted in a reflective cup of a package body 125 and emitting blue light, and a wavelength conversion part 150d encapsulating the light emitting element 130. The fluoride phosphor 154 emitting red light and the green phosphor 156 are dispersed in the wavelength conversion part 150d. In an exemplary embodiment, a yellow or an orange yellow phosphor may be further included.

Figure 14:
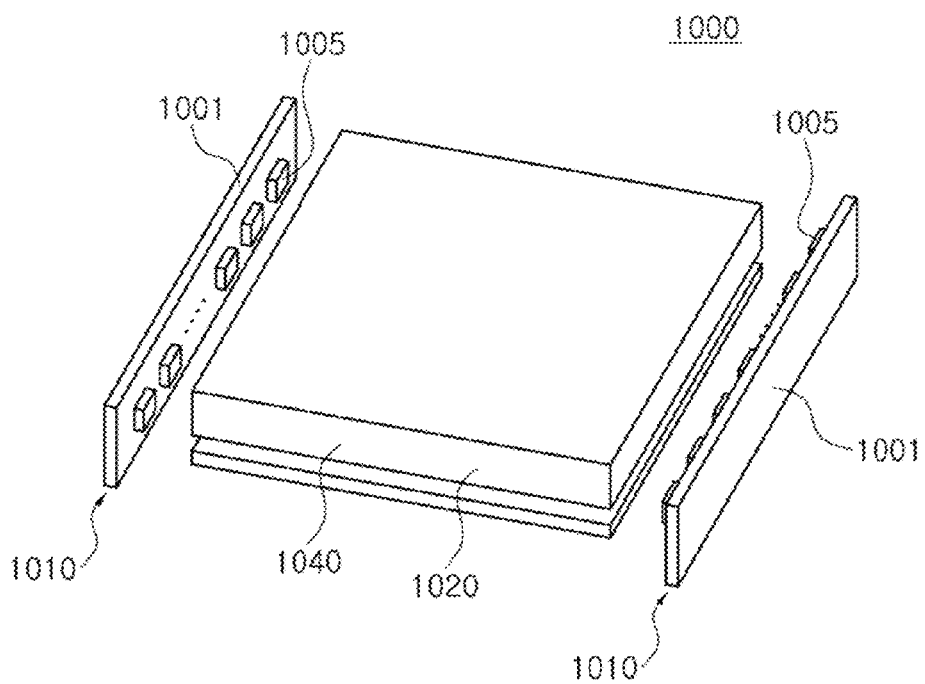
FIG. 14 is a schematic cross-sectional view of a backlight unit according to an exemplary embodiment of the present inventive concept.

FIG. 14 is a schematic cross-sectional view of a backlight unit according to an exemplary embodiment of the present inventive concept.

Referring to FIG. 14, a backlight unit 1000 may include a light guiding plate 1040 and light source modules 1010 provided on two opposite side surfaces of the light guiding plate 1040. Further, the backlight unit 1000 may further include a reflective plate 1020 disposed on a lower portion of the light guiding plate 1040. The backlight unit 1000 according to the exemplary embodiment may be an edge type backlight unit.

Depending on exemplary embodiments, the light guiding plate 1040 may be provided on one side surface of the light source module 1010 or may be additionally provided on another side surface of the light source module 1010. The light source module 1010 may include a printed circuit board 1001 and a plurality of light emitting devices 1005 mounted on an upper surface of the printed circuit board 1001. The light emitting device 1005 may include one of the light emitting devices 100, 100a and 100b illustrated in FIGS. 5 through 7. Alternatively, the light source module 1010 may employ the light source modules 500 and 600 for an LCD backlight unit of FIGS. 12 and 13.

Figure 15:
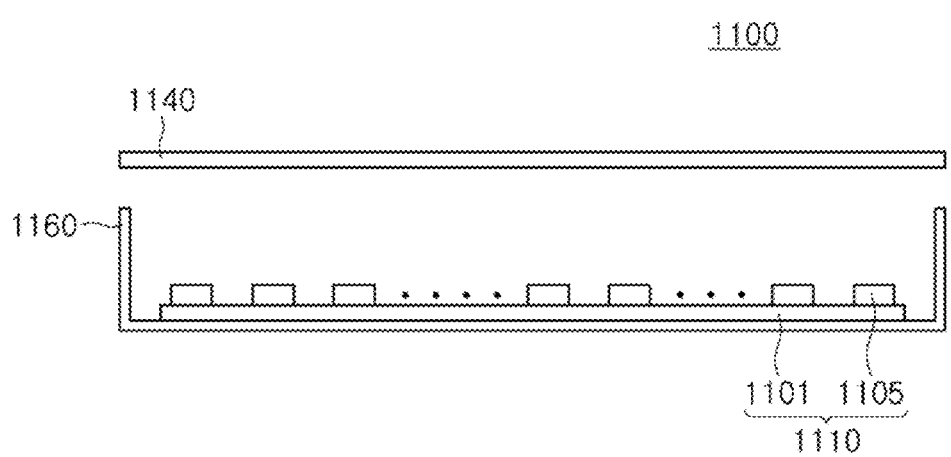
FIG. 15 is a schematic cross-sectional view of a backlight unit according to an exemplary embodiment of the present inventive concept.

FIG. 15 is a schematic cross-sectional view of a backlight unit according to an exemplary embodiment of the present inventive concept.

Referring to FIG. 15, a backlight unit 1100 may include a light diffusing plate 1140 and a light source module 1110 disposed below the light diffusing plate 1140. In addition, the backlight unit 1100 may further include a bottom case 1160 disposed below the light diffusing plate 1140 and accommodating the light source module 1110 therein. The backlight unit 1100 according to the exemplary embodiment may be a direct type backlight unit.

The light source module 1110 may include a printed circuit board 1101 and a plurality of light emitting devices 1105 mounted on an upper surface of the printed circuit board 1101. The light emitting device 1105 may include one of the light emitting devices 100, 100a and 100b illustrated in FIGS. 5 through 7. Alternatively, the light source module 1010 may employ the light source modules 500 and 600 for an LCD backlight unit of FIGS. 12 and 13.

Figure 16:
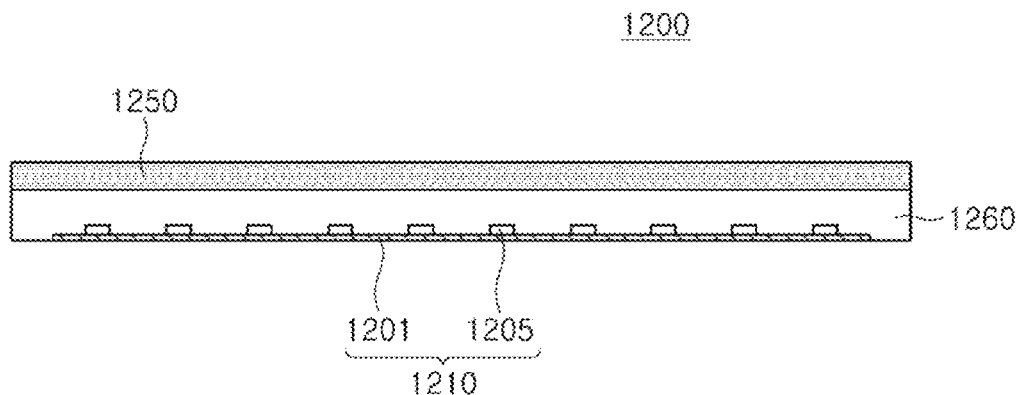
FIGS. 16 through 18 are schematic cross-sectional views each illustrating a backlight unit according to an exemplary embodiment of the present inventive concept.
Figure 17:
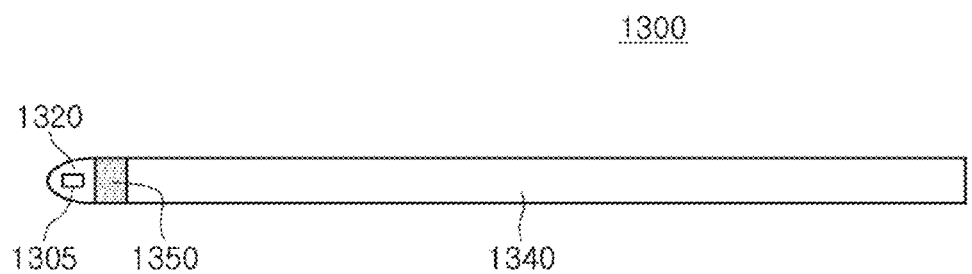
Figure 18:
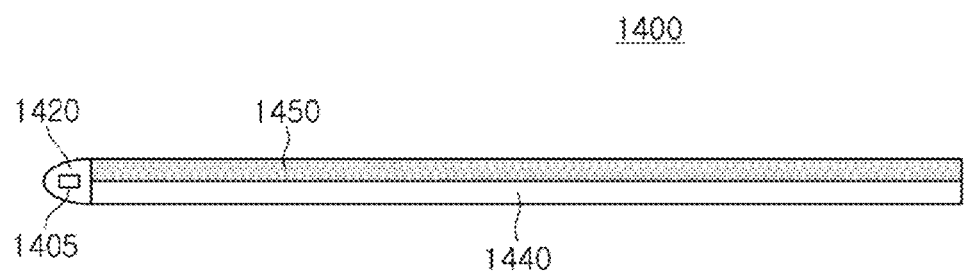

FIGS. 16 through 18 are schematic cross-sectional views each illustrating a backlight unit according to an exemplary embodiment of the present inventive concept.

In backlight units 1200, 1300 and 1400 of FIGS. 16 to 18, the wavelength conversion part 150 (see FIG. 5) may not be disposed within the light emitting devices 1205, 1305 and 1405, while being disposed outwardly of light emitting devices 1205, 1305 and 1405, and may convert light.

Referring to FIG. 16, the backlight unit 1200 may be a direct type backlight unit and may include a wavelength conversion part 1250, a light source module 1210 disposed below the wavelength conversion part 1250, and a bottom case 1260 accommodating the light source module 1210 therein. The light source module 1210 may include a printed circuit board 1201 and a plurality of light emitting devices 1205 mounted on an upper surface of the printed circuit board 1201. The light emitting device 1205 may include a light emitting device in which the wavelength conversion part 150, 150a, or 150b is omitted from one of the light emitting devices 100, 100a and 100b illustrated in FIGS. 5 through 7.

In the backlight unit 1200 according to the exemplary embodiment, the wavelength conversion part 1250 may be disposed on the bottom case 1260. The wavelength conversion part 1250 may include a fluoride phosphor in a similar manner to the wavelength conversion part 150 of FIG. 5. Thus, at least a portion of light emitted by the light source module 1210 may be wavelength-converted by the wavelength conversion part 1250. The wavelength conversion part 1250 may be manufactured and used as a separate film, but may be integrally combined with a light diffusing plate.

Referring to FIGS. 17 and 18, the backlight units 1300 and 1400 may be edge type backlight units and include wavelength conversion parts 1350 and 1450, light guiding plates 1340 and 1440, reflective parts 1320 and 1420 disposed at one ends of the light guiding plates 1340 and 1440, and light sources 1305 and 1405.

Light emitted by the light sources 1305 and 1405 may be guided to the interiors of the light guiding plates 1340 and 1440 by the reflective parts 1320 and 1420. In the backlight unit 1300 of FIG. 17, the wavelength conversion part 1350 may be disposed between the light guiding plate 1340 and the light source 1305. In the backlight unit 1400 of FIG. 18, the wavelength conversion part 1450 may be disposed on a light emitting surface of the light guiding plate 1440.

The light source 1305 or 1405 may include a light emitting device in which the wavelength conversion part 150, 150a, or 150b is omitted from one of the light emitting devices 100, 100a and 100b illustrated in FIGS. 5 through 7.

Figure 19:
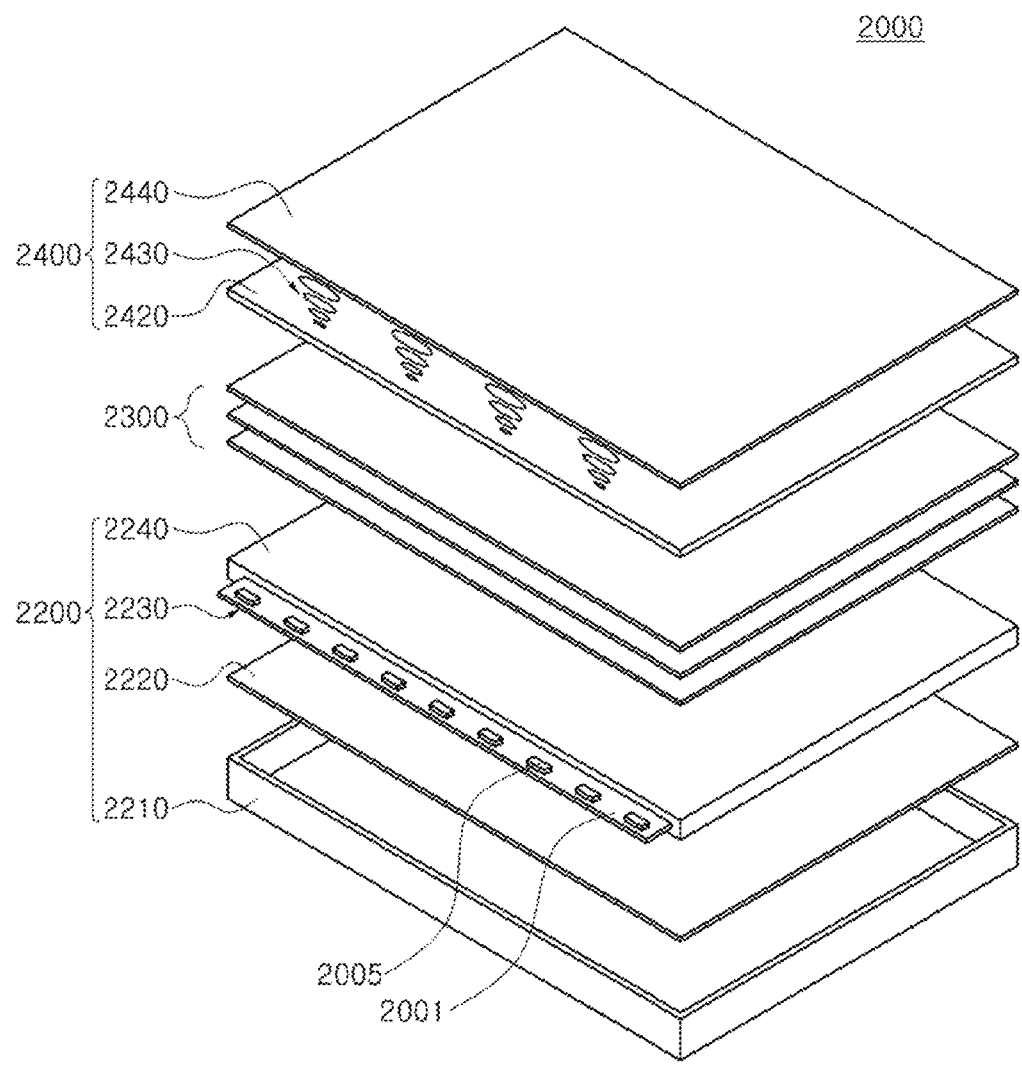
FIG. 19 is an exploded perspective view of a display device according to an exemplary embodiment of the present inventive concept.

FIG. 19 is an exploded perspective view of a display device according to an exemplary embodiment of the present inventive concept.

Referring to FIG. 19, a display apparatus 2000 may include a backlight unit 2200, optical sheets 2300, and an image display panel 2400 such as a liquid crystal panel.

The backlight unit 2200 may include a bottom case 2210, a reflective plate 2220, a light guiding plate 2240, and a light source module 2230 provided on at least one side surface of the light guiding plate 2240. The light source module 2230 may include a printed circuit board 2001 and light emitting devices 2005. The light emitting devices 2005 may include one of the light emitting devices 100, 100a and 100b illustrated in FIGS. 5 through 7. In particular, the light emitting device 2005 may be a side-view type light emitting device in which a mounting surface thereof is a side surface adjacent to a light emitting surface thereof. In addition, depending on exemplary embodiments, the backlight unit 2200 may be substituted with one of the backlight units 1000, 1100, 1200, 1300 and 1400 of FIGS. 14 through 18.

The optical sheets 2300 may be disposed between the light guiding plate 2240 and the image display panel 2400, and may include various types of sheets such as a diffusion sheet, a prism sheet, or a protective sheet.

The image display panel 2400 may display an image using light emitted through the optical sheets 2300. The image display panel 2400 may include an array substrate 2420, a liquid crystal layer 2430, and a color filter substrate 2440. The array substrate 2420 may include pixel electrodes arranged in a matrix form, thin film transistors applying a driving voltage to the pixel electrodes, and signal lines for operating the thin film transistors. The color filter substrate 2440 may include a transparent substrate, a color filer, and a common electrode. The color filter may include filter elements allowing light having a certain wavelength from among white light emitted by the backlight unit 2200 to selectively pass therethrough. The liquid crystal layer 2430 may be rearranged due to an electrical field formed between the pixel electrode and the common electrode, thereby controlling light transmissivity. Light having controlled light transmissivity may pass through the color filter of the color filter substrate 2440 to display an image. The image display panel 2400 may further include a driving circuit unit processing an image signal and the like.

According to the display apparatus 2000 according to the exemplary embodiment, the light emitting device 2005 emitting blue light, green light and red light having a relatively small full width at half maximum may be used. Thus, after the emitted light passes through the color filter substrate 2440, blue light, green light and red light having high color purity may be realized.

Figure 20:
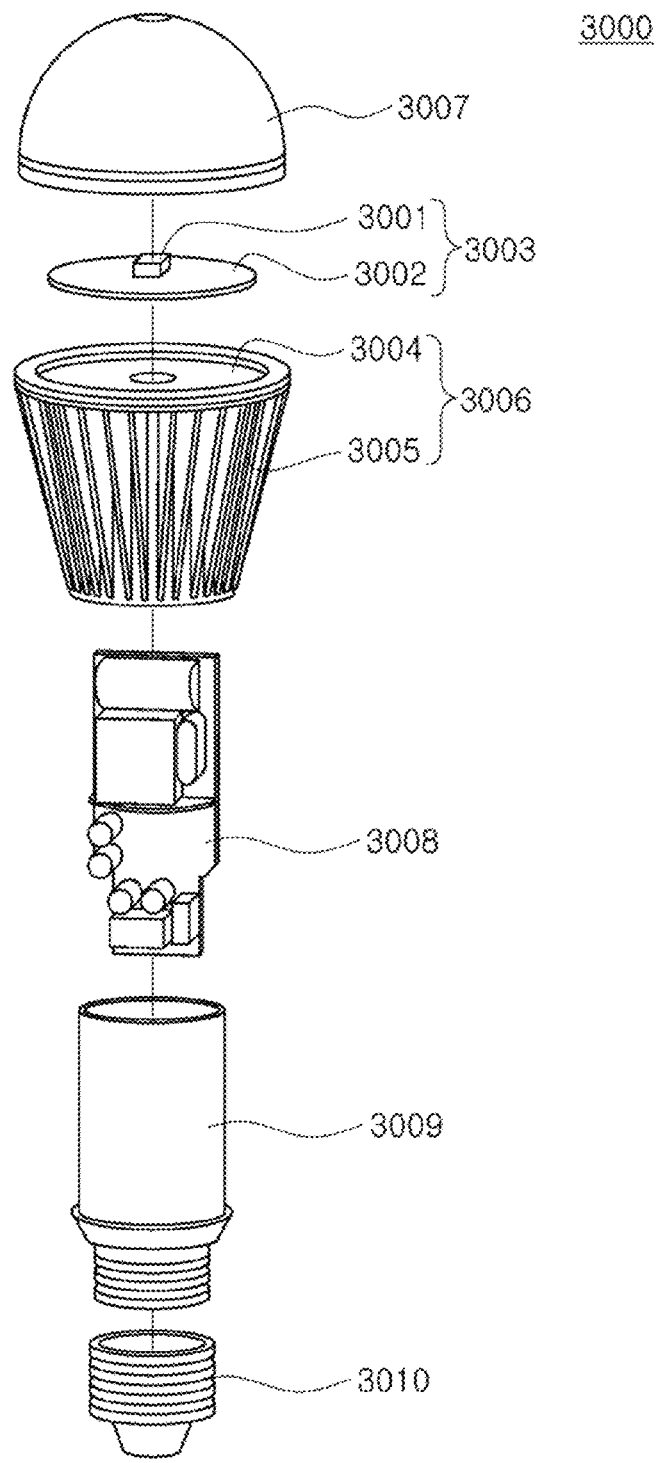
FIG. 20 is an exploded perspective view of a lighting device according to an exemplary embodiment of the present inventive concept.

FIG. 20 is an exploded perspective view of a lighting device according to an exemplary embodiment of the present inventive concept.

Referring to FIG. 20, a lighting device 3000 is exemplified as a bulb-type lamp, and includes a light source module 3003, a driving unit 3008, and an external connector unit 3010. In addition, exterior structures such as an external housing 3006, an internal housing 3009, a cover unit 3007 and the like may be additionally included. The light source module 3003 may include a semiconductor light emitting device 3001 having a structure the same as or similar to those of the light emitting devices 100, 100a, and 100b illustrated in FIGS. 5 through 7, and a circuit board 3002 on which the semiconductor light emitting device 3001 is mounted. The embodiment illustrates the case in which a single semiconductor light emitting device 3001 is mounted on the circuit board 3002, however, if necessary, a plurality of semiconductor light emitting devices may be mounted thereon.

The external housing 3006 may serve as a heat radiating part, and include a heat sink plate 3004 in direct contact with the light source module 3003 to improve the dissipation of heat and heat radiating fins 3005 covering a lateral surface of the lighting device 3000. The cover unit 3007 may be mounted above the light source module 3003 and may have a convex lens shape. The driving unit 3008 may be disposed inside the internal housing 3009 and may be connected to the external connector unit 3010, such as a socket structure, to receive power from an external power source. In addition, the driving unit 3008 may convert the received power into a current source appropriate for driving the light source 3001 of the light source module 3003 and supply the converted current source thereto. For example, the driving unit 3008 may be configured of an AC-DC converter, a rectifying circuit part, or the like.

Further, although not illustrated in the drawings, the lighting device 3000 may further include a communications module.

Figure 21:
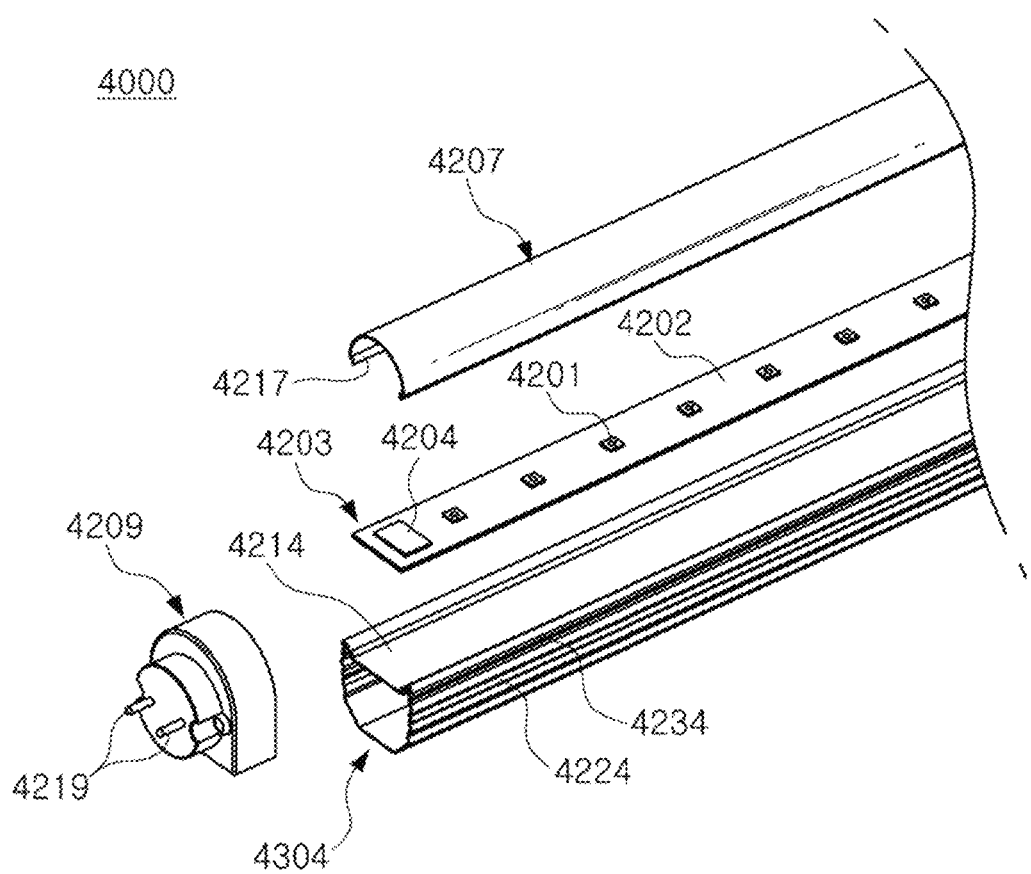
FIG. 21 is an exploded perspective view of a lighting device according to an exemplary embodiment of the present inventive concept.

FIG. 21 is an exploded perspective view of a lighting device according to an according to an exemplary embodiment of the present inventive concept.

Referring to FIG. 21, a lighting device 4000 according to the exemplary embodiment may include a light source module 4203, a body part 4304, and a driving part 4209 and may further include a cover part 4207 covering the light source module 4203. The lighting device 4000, a bar-type lamp, may have a shape similar to that of a fluorescent lamp and may emit light having optical characteristics similar to those of the fluorescent lamp, but is not limited to having such characteristics.

The light source module 4203 may include amounting substrate 4202 and a plurality of light emitting elements 4201 mounted on the mounting substrate 4202. The plurality of light emitting elements 4201 may have a structure the same as or similar to those of the light emitting devices 100, 100a, and 100b illustrated in FIGS. 5 through 7. Alternatively, the light source module 4203 may employ the light source modules 500 and 600 for an LCD backlight unit of FIGS. 12 and 13.

Each of the light emitting elements 4201 may be adhered to the mounting substrate 4202 by an adhesive member, and the adhesive member may have a scattering pattern.

The body part 4304 may have the light source module 4203 mounted on one surface thereof to be fixed thereto. The body part 4304 may be a sort of support structure and include a heat sink. The body part 4304 may be formed of a material having high thermal conductivity so as to emit heat generated from the light source module 4203 outwardly. For example, the body part 4304 may be formed of a metal material, but is not limited thereto. The body part 4304 may have an elongated bar shape corresponding to a shape of the mounting substrate 4202 of the light source module 4203, overall. The body part 4304 may have a recess 4214 formed in a surface thereof on which the light source module 4203 is mounted, the recess 4214 being capable of receiving the light source module 4203 therein. A plurality of heat radiating fins 4224 for the radiation of heat may be formed on at least one or more outer side surfaces of the body part 4304 so as to protrude therefrom. Catching grooves 4234 may be formed in the outer side surfaces of the body part 4304 at both sides of the recess 4214, the catching grooves 4234 being extended in a length direction of the body part 4304. The cover part 4207 may be coupled to the catching grooves 4234. At least one end of the body part 4304 in the length direction may be opened and thus, the body part 4304 may have a pipe shape having at least one open end.

The driving part 4209 may be provided in an open end of the body part 4304 in the length direction and supply driving power to light source module 4203. The driving part 4209 may include outwardly protruded electrode pins 4219.

The cover part 4207 may be coupled to the body part 4304 and cover the light source module 4203. The cover part 4207 may be formed of a light transmissive material. The cover part 4207 may have a semicircular curved surface to enable light to be generally externally irradiated in a uniform manner. In addition, a bottom surface of the cover part 4207 coupled to the body part 4304 thereof may be provided with protrusions 4217 formed in the length direction of the cover part 4207 and engaged with the catching grooves 4234 of the body part 4304.

The exemplary embodiment illustrates that the cover part 4207 has a semicircular shape, but the cover part 4207 is not limited thereto. Such a shape of the cover part 4207 may be variously changed depending on a design of a lighting device from which light is irradiated. For example, the cover part 4207 may have a flat quadrangular shape and may also have other polygonal shapes.

Figure 22:
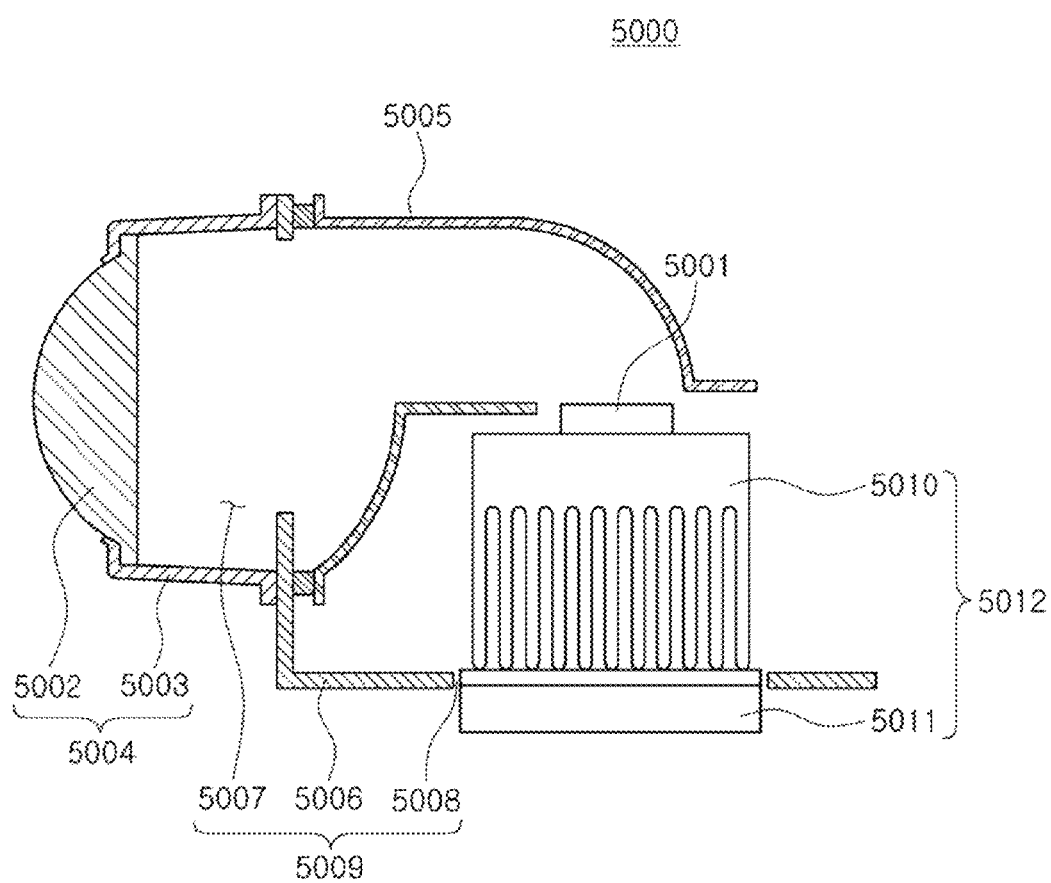
FIG. 22 is a schematic cross-sectional view of a head lamp according to an exemplary embodiment of the present inventive concept.

FIG. 22 is a schematic cross-sectional view of a headlamp according to an exemplary embodiment of the present inventive concept.

Referring to FIG. 22, a headlamp 5000 used as a vehicle lighting element or the like may include a light source 5001, a reflective unit 5005 and a lens cover unit 5004, the lens cover unit 5004 including a hollow guide part 5003 and a lens 5002. The light source 5001 may include at least one of the light emitting devices 100, 100a and 100b of FIGS. 5 through 7. The headlamp 5000 may further include a heat radiating unit 5012 dissipating heat generated by the light source 5001 outwardly. The heat radiating unit 5012 may include a heat sink 5010 and a cooling fan 5011 in order to effectively dissipate heat. In addition, the headlamp 5000 may further include a housing 5009 allowing the heat radiating unit 5012 and the reflective unit 5005 to be fixed thereto and supported thereby. The housing 5009 may include a body part 5006 and a central hole 5008 to which the heat radiating unit 5012 is coupled, the central hole 5008 being formed in one surface of the housing 5009. The other surface of the housing 5009 integrally connected to and bent in a direction perpendicular to the one surface of the housing 5009 may be provided with a forward hole 5007. The reflective unit 5005 may be fixed to the housing 5009, whereby light having been generated by the light source 5001 may be reflected and pass through the forward hole 5007 to thereby be emitted outwardly.

As set forth above, according to exemplary embodiments of the present inventive concept, a fluoride phosphor and a light emitting device in which optical characteristics such as color reproducibility and reliability are improved by decreasing a composition ratio of an activator, may be provided, and methods of manufacturing the same may be provided.

Various advantages and effects in exemplary embodiments of the present inventive concept are not limited to the above-described descriptions and may be easily understood through explanations of concrete embodiments of the present inventive concept.

While exemplary embodiments have been shown and described above, it will be apparent to those skilled in the art that modifications and variations could be made without departing from the spirit and scope of the present inventive concept as defined by the appended claims.

What is claimed is:

1. A light emitting device comprising:
   a light emitting element disposed on a substrate;
   a wavelength conversion part absorbing excitation light emitted by the light emitting element and emitting visible light;
   a body part having a cavity; and
   a protective layer disposed at a bottom of the cavity between the wavelength conversion part and the substrate,
   wherein the wavelength conversion part includes: a fluoride phosphor including a fluoride represented by a composition formula: $A_xMF_y:Mn_z^{4+}$, where A is at least one selected from among Li, Na, K, Rb, and Cs, M is at least one selected from among Si, Ti, Zr, Hf, Ge and Sn, a composition ratio (x) of A satisfies $2 \leq x \leq 3$, a composition ratio (y) of F satisfies $4 \leq y \leq 7$, and a composition ratio (z) of Mn satisfies $0 < z \leq 0.17$, and
   the wavelength conversion part contacts an upper surface of the light emitting element.

2. The light emitting device of claim 1, wherein in the fluoride phosphor, Mn is contained in an amount of 3.4 wt. % to 3.8 wt. %.

3. The light emitting device of claim 1, wherein the fluoride phosphor is $K_2SiF_6:Mn^{4+}$.

4. The light emitting device of claim 1, wherein the light emitting element emits light having a peak wavelength within a range of 300 nm to 500 nm.

5. The light emitting device of claim 1, wherein the fluoride phosphor emits red light having a peak wavelength within a range of 620 nm to 640 nm.

6. The light emitting device of claim 1, wherein in the fluoride phosphor, the composition ratio (z) of Mn satisfies $0.10 \leq z \leq 0.17$.

7. The light emitting device of claim 1, wherein the wavelength conversion part further includes: a green phosphor absorbing the excitation light emitted by the light emitting element and emitting green light.

8. The light emitting device of claim 7, wherein the green phosphor emits green light having a peak wavelength within a range of 500 nm to 600 nm.

9. The light emitting device of claim 1, wherein the light emitting element simultaneously emits blue light and green light.

10. The light emitting device of claim 1, wherein the wavelength conversion part further includes: an organic or inorganic material coating layer coated on a surface of the fluoride phosphor.

11. The light emitting device of claim 1, wherein operational characteristics of the light emitting device indicate variations in luminance having elapsed decreases of about 6.3% after 500 hours under operational conditions at a temperature of 85 degrees Celsius and a humidity of 85%.

12. The light emitting device of claim 1, wherein OFF-state characteristics of the light emitting devices indicate variations in luminance having elapsed decreases of about 0.4% after 500 hours at a temperature of 85 degrees Celsius and a humidity of 85%.

13. A light emitting device comprising:
   a light emitting element disposed on a substrate;
   a wavelength conversion part absorbing excitation light emitted by the light emitting element and emitting visible light;
   a body part having a cavity; and
   a protective layer disposed at the bottom of the cavity between the light emitting element and the substrate and having a thickness less than a thickness of the light emitting element,
   wherein the wavelength conversion part includes: a fluoride phosphor including a fluoride represented by a composition formula: $A_xMF_y:Mn_z^{4+}$, where A is at least one selected from among Li, Na, K, Rb, and Cs, M is at least one selected from among Si, Ti, Zr, Hf, Ge and Sn, a composition ratio (x) of A satisfies $2 \leq x \leq 3$, a composition ratio (y) of F satisfies $4 \leq y \leq 7$, and a composition ratio (z) of Mn satisfies $0 < z \leq 0.17$, and
   wherein the wavelength conversion part contacts an upper surface of the light emitting element.

14. A light emitting device comprising:
   a substrate;
   a light emitting element mounting on the substrate;
   a wavelength conversion part configured to absorb excitation light emitted by the light emitting element and emit visible light;
   a body part having a cavity; and
   a protective layer disposed at the bottom of the cavity between the wavelength conversion part and the substrate and having a thickness less than a thickness of the light emitting element,
   wherein the wavelength conversion part includes: a fluoride phosphor including a fluoride represented by a composition formula: $A_xMF_y:Mn_z^{4+}$, where A is at least one selected from among Li, Na, K, Rb, and Cs, M is at least one selected from among Si, Ti, Zr, Hf, Ge and Sn, a composition ratio (x) of A satisfies $2 \leq x \leq 3$, a composition ratio (y) of F satisfies $4 \leq y \leq 7$, and a composition ratio (z) of Mn satisfies $0 < z \leq 0.17$.

15. A light emitting device comprising:
   a light emitting element disposed on a substrate;
   a wavelength conversion part configured to absorb excitation light emitted by the light emitting element and emitting visible light;
   a body part having a cavity, an inside wall of the cavity forming a concave surface; and
   a protective layer disposed at the bottom of the cavity between the light emitting element and the substrate,
   wherein the wavelength conversion part includes: a fluoride phosphor including a fluoride represented by a composition formula: $A_xMF_y:Mn_z^{4+}$, where A is at least one selected from among Li, Na, K, Rb, and Cs, M is at least one selected from among Si, Ti, Zr, Hf, Ge and Sn, a composition ratio (x) of A satisfies $2 \leq x \leq 3$, a composition ratio (y) of F satisfies $4 \leq y \leq 7$, and a composition ratio (z) of Mn satisfies $0 < z \leq 0.17$.

* * * * *